United States Patent
Wei et al.

(10) Patent No.: US 9,006,793 B2
(45) Date of Patent: Apr. 14, 2015

(54) NON-VOLATILE MEMORY CELL, NON-VOLATILE MEMORY CELL ARRAY, AND METHOD OF MANUFACTURING THE SAME

(75) Inventors: Zhiqiang Wei, Osaka (JP); Takeshi Takagi, Kyoto (JP); Mitsuteru Iijima, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 469 days.

(21) Appl. No.: 13/382,321

(22) PCT Filed: Jun. 29, 2011

(86) PCT No.: PCT/JP2011/003697
§ 371 (c)(1),
(2), (4) Date: Jan. 6, 2012

(87) PCT Pub. No.: WO2012/001960
PCT Pub. Date: Jan. 5, 2012

(65) Prior Publication Data
US 2012/0104351 A1 May 3, 2012

(30) Foreign Application Priority Data
Jul. 1, 2010 (JP) .................................. 2010-151400

(51) Int. Cl.
*H01L 27/115* (2006.01)
*H01L 21/8247* (2006.01)
(Continued)

(52) U.S. Cl.
CPC ........ *H01L 27/2409* (2013.01); *G11C 13/0007* (2013.01); *G11C 2213/71* (2013.01); *G11C 2213/72* (2013.01); *H01L 45/146* (2013.01); *H01L 45/16* (2013.01)

(58) Field of Classification Search
USPC .............. 257/4, E45.002, 295, 421, E27.004, 257/E27.006
See application file for complete search history.

(56) References Cited

U.S. PATENT DOCUMENTS

| 6,753,561 B1 * | 6/2004 | Rinerson et al. ............... 257/295 |
| 8,565,003 B2 * | 10/2013 | Siau .............................. 365/148 |

(Continued)

FOREIGN PATENT DOCUMENTS

| CN | 1763985 A | 4/2006 |
| JP | 2008-181978 | 8/2008 |

(Continued)

OTHER PUBLICATIONS

Chinese Office Action, issued Feb. 8, 2014 in corresponding Chinese Application No. 201180002654.2 (with partial English translation).

(Continued)

*Primary Examiner* — Telly Green
*Assistant Examiner* — Tsz Chiu
(74) *Attorney, Agent, or Firm* — Wenderoth, Lind & Ponack, L.L.P.

(57) ABSTRACT

A stacking structure in which a stacked body (21) including a first conductive layer (13), a semiconductor layer (17), and a second conductive layer (18) and an interlayer insulating film (16) are alternately stacked in parallel to a substrate, a plurality of columnar electrodes (12) arranged so as to penetrated through the stacking structure in a stacking direction, a variable resistance layer (14) which is disposed between the columnar electrode (12) and the first conductive layer (13) and which has a resistance value that reversibly changes according to an application of an electric signal are included. The variable resistance layer (14) is formed by oxidizing part of the first conductive layer (13). The variable resistance layer (14) and an insulating film for electrically separating the semiconductor layer (17) and the second conductive layer (18) from the columnar electrode (12) are simultaneously formed in a single oxidation process.

21 Claims, 19 Drawing Sheets

(51) Int. Cl.
*H01L 27/24* (2006.01)
*H01L 45/00* (2006.01)
*G11C 13/00* (2006.01)

(56) References Cited

U.S. PATENT DOCUMENTS

| | | | | |
|---|---|---|---|---|
| 8,859,327 | B2* | 10/2014 | Nansei | 438/102 |
| 2006/0081962 | A1 | 4/2006 | Wei et al. | |
| 2007/0015328 | A1* | 1/2007 | Hsu et al. | 438/250 |
| 2008/0175032 | A1 | 7/2008 | Tanaka et al. | |
| 2009/0141547 | A1* | 6/2009 | Jin et al. | 365/163 |
| 2009/0146190 | A1* | 6/2009 | Fukuzumi et al. | 257/204 |
| 2009/0283736 | A1 | 11/2009 | Kanzawa et al. | |
| 2009/0321878 | A1* | 12/2009 | Koo et al. | 257/536 |
| 2010/0072452 | A1* | 3/2010 | Kim et al. | 257/4 |
| 2010/0157658 | A1* | 6/2010 | Schloss et al. | 365/148 |
| 2010/0219392 | A1* | 9/2010 | Awaya et al. | 257/3 |
| 2010/0321982 | A1* | 12/2010 | Takagi et al. | 365/148 |
| 2012/0104350 | A1* | 5/2012 | Himeno et al. | 257/4 |
| 2013/0113080 | A1* | 5/2013 | Hioka et al. | 257/532 |

FOREIGN PATENT DOCUMENTS

| | | |
|---|---|---|
| JP | 2009-081251 | 4/2009 |
| JP | 2009-135328 | 6/2009 |
| JP | 2009-135489 | 6/2009 |
| JP | 2010-010688 | 1/2010 |
| JP | 2010-074169 | 4/2010 |
| WO | 2008/149484 | 12/2008 |

OTHER PUBLICATIONS

International Search Report issued Aug. 30, 2011 in International (PCT) Application No. PCT/JP2011/003697.

* cited by examiner

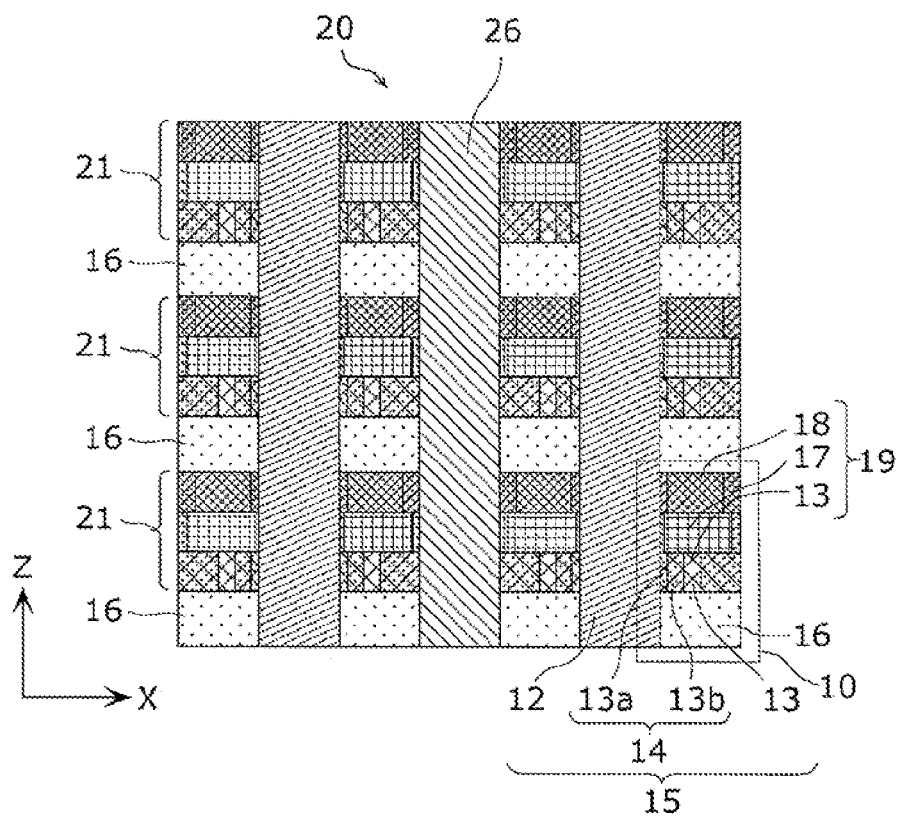
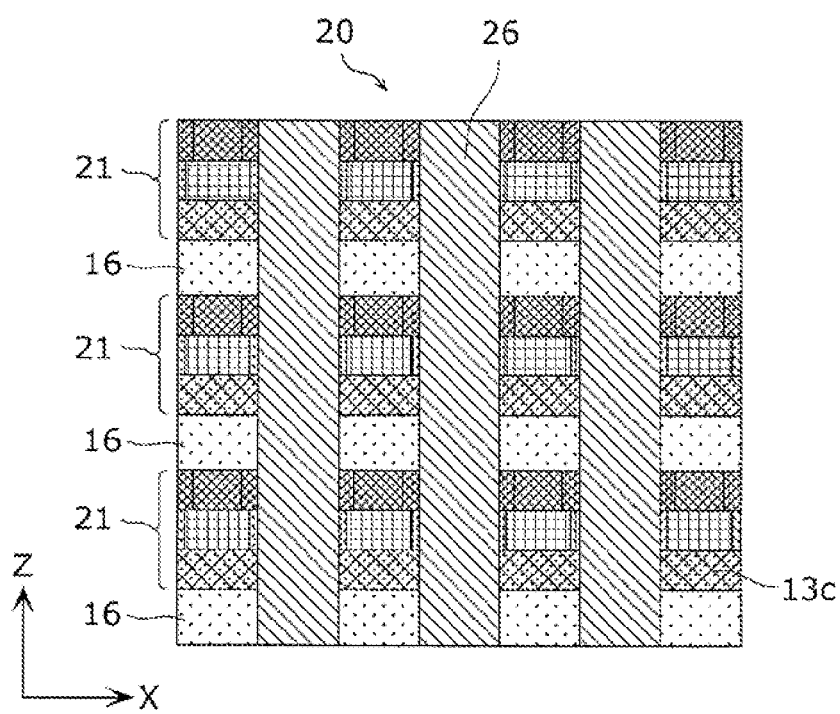

NON-VOLATILE MEMORY CELL, NON-VOLATILE MEMORY CELL ARRAY, AND METHOD OF MANUFACTURING THE SAME

TECHNICAL FIELD

The present invention relates to a non-volatile memory cell including a variable resistance element which has a resistance value that in reversibly changes in response to an application of an electric signal and a diode element having a bidirectional rectification property, a non-volatile memory cell array in which a plurality of the non-volatile memory cells are arranged, and a method of manufacturing the non-volatile memory cell array.

BACKGROUND ART

With the progress of the digital technology in electric devices in recent years, demands for nonvolatile memory devices with a large capacity have been increasing for storing data such as music, images, information, and so on. As a measure to meet such demands, a non-volatile memory device (hereinafter referred to as ReRAM) has been attracting attention, which includes, as a memory cell, a variable resistance layer which has a resistance value that changes in response to a provided electric pulse and holds the state. This is because the ReRAM has characteristics that the structure as a memory cell is comparatively simple and suitable for increasing density, and that it is easy to ensure consistency with conventional semiconductor processes.

With such a ReRAM, a material which can stably cause a designed change in a resistance value with an excellent reproducibility even when a memory cell is miniaturized and establishment of a manufacturing process of the memory cell are required. Research and development for such a material and a manufacturing process are actively conducted.

A memory cell array having a stacking structure is proposed as a structure allowing further dense integration in the ReRAM.

FIG. 16 shows diagrams of a memory cell array having a conventional stacking structure, an enlarged view of a memory cell, and an equivalent circuit diagram of the memory cell, disclosed by Patent Literatures 1 and 2. The memory cell array includes: a stacked body in which a plurality of conductive layers (N-type polysilicon) 1511 and a plurality of interlayer insulating films 1512 are alternately stacked; a variable resistance layer 1515 formed to perpendicularly cross the stacked body and to have a cylindrical shape; a metal layer 1516 formed to be in contact with an inner periphery of the variable resistance layer 1515 and to have a cylindrical shape; a columnar electrode 1517 formed to be in contact with an inner periphery of the metal layer 1516 having the cylindrical shape; a P-type polysilicon layer 1513 interposed between the variable resistance layer 1515 having the cylindrical shape and the N-type polysilicon layer 1511 to be in contact with the N-type polysilicon layer 1511; and a metal silicide layer 1514 which is in contact with the P-type silicon layer 1513.

In one memory cell included in the memory cell array, a stacked body having the metal layer 1516, the variable resistance layer 1515, and the metal silicide layer 1514 serves as a variable resistance element, and a stacked body having the P-type polysilicon layer 1513 and the N-type polysilicon layer 1511 serves as a PN diode.

In addition, FIG. 17 shows a memory cell array having a conventional stacking structure disclosed by Patent Literature 3. The memory cell array includes: a stacked body in which a plurality of conductive layers 1611 and a plurality of interlayer insulating films 1612 are alternately stacked; a variable resistance layer 1613 formed to perpendicularly cross the stacked body and to have a cylindrical shape; a first semiconductor layer 1614 formed to be in contact with an inner periphery of the variable resistance layer 1613 and to have a cylindrical shape; a second semiconductor layer 1615 formed to be in contact with an inner periphery of the first semiconductor layer 1614 and to have a cylindrical shape; and a columnar electrode 1616 formed to be in contact with an inner periphery of the second semiconductor layer 1615.

CITATION LIST

Patent Literature

[PTL 1]
Japanese Unexamined Patent Application Publication No. 2008-181978
[PTL 2]
Japanese Unexamined Patent Application Publication No. 2009-135328
[PTL 3]
Japanese Unexamined Patent Application Publication No. 2009-135489

SUMMARY OF INVENTION

Technical Problem

However, with the structures disclosed by Patent Literatures 1 and 2, a step of embedding each material into a contact hole needs to be performed four times in total; that is, for the metal silicide layer 1514, the variable resistance layer 1515, the metal layer 1516, and the columnar electrode 1517. With the structure disclosed by Patent Literature 3, the step of embedding each material into a contact hole needs to be performed four times in total; that is, for the variable resistance layer 1613, the first semiconductor layer 1614, the second semiconductor layer 1615, and the columnar electrode 1616, and thus there is a problem of increasing complexity in manufacturing procedures.

An object of the present invention is to provide a non-volatile memory cell and a non-volatile memory cell array which solve the above-described problem, involve simple manufacturing procedures, and have a stable memory performance, and a method of manufacturing the same.

Solution to Problem

In order to solve the above-described conventional problem, a nonvolatile memory cell according to an aspect of the present invention includes: a columnar electrode disposed perpendicular to a main surface of a substrate; a first conductive layer disposed parallel to the main surface of the substrate; a semiconductor layer disposed in contact with the first conductive layer in a stacking direction; a second conductive layer disposed in contact with the semiconductor layer in the stacking direction; a variable resistance layer disposed between the columnar electrode and the first conductive layer, the variable resistance layer having a resistance value that reversibly changes according to an application of an electric signal; an oxide insulating layer disposed between the columnar electrode and the semiconductor layer, the oxide insulating layer comprising a same constituent element as a constituent element of the semiconductor layer; and an insulating layer disposed between the columnar electrode and the second conductive layer.

Here, the semiconductor layer may be disposed on the first conductive layer, the second conductive layer may be disposed on the semiconductor layer, and the variable resistance layer may comprise a same constituent element as a constituent element of the first conductive layer.

In addition, the variable resistance layer may include a first variable resistance layer and a second variable resistance layer which are stacked in a direction parallel to the main surface of the substrate, the first variable resistance layer having a first metal oxide, and the second variable resistance layer having a second metal oxide of which a degree of oxygen deficiency is larger than a degree of oxygen deficiency of the first metal oxide.

In the above-described structure, the columnar electrode, the variable resistance layer, and the first conductive layer are included in the variable resistance element in parallel with the main surface of the substrate. The first conductive layer, the semiconductor layer, and to the second conductive layer are included in a diode element having a bidirectional rectification property in a direction perpendicular to the main surface of the substrate. As a result, the non-volatile memory cell that includes the variable resistance element and the diode element which are connected to each other in series.

A nonvolatile memory cell array according to an aspect of the present invention includes: a plurality of columnar electrodes disposed perpendicular to a main surface of a substrate; a stacking structure in which a plurality of stacked bodies and a plurality of interlayer insulating films are alternately stacked, each of the stacked bodies including: a first conductive layer disposed parallel to the main surface of the substrate; a semiconductor layer disposed in contact with the first conductive layer in a stacking direction; and a second conductive layer disposed in contact with the semiconductor layer in the stacking direction; a variable resistance layer disposed between the first conductive layer and a corresponding one of the columnar electrodes, the variable resistance layer having a resistance value that reversibly changes according to an application of an electric signal; an oxide insulating layer disposed between the columnar electrode and the semiconductor layer, the oxide insulating layer comprising a same constituent element as a constituent element of the semiconductor layer; and an insulating layer disposed between the columnar electrode and the second conductive layer.

A method of manufacturing a nonvolatile memory cell array according to an aspect of the present invention includes: a step (a) of (i) forming a stacking structure by stacking, above a substrate, an interlayer insulating film, a first conductive layer, a semiconductor layer, and a second conductive layer, in parallel to a main surface of the substrate, and (ii) further forming one or more stacking structures each of which is a same as the stacking structure, in parallel to the main surface of the substrate; a step (b) of forming a plurality of strip-shaped trenches penetrating through the stacking structures in a stacking direction; a step (c) of simultaneously forming, by oxidizing a surface layer of a side face of the stacking structure exposed to a side face of each of the strip-shaped trenches, (i) a variable resistance layer on a surface layer of a side face of the first conductive layer and (ii) an insulating film on a surface layer of a side face of each of the semiconductor layer and the second conductive layer, the variable resistance layer having a resistance value that reversibly changes according to an application of an electric signal; a step (d) of forming a contact hole by embedding a polysilicon in each of the strip-shaped trenches and removing part of the polysilicon through etching; a step (e) of forming a columnar electrode in the contact hole by embedding a conductive material in the contact hole, the columnar electrode being connected to the variable resistance layer; a step (f) of removing a remnant of the polysilicon in the strip-shaped trench; and a step (g) of forming an insulating film by oxidizing the first conductive layer exposed to a space created by removing the remnant of the polysilicon in the strip-shaped trench.

A method of manufacturing a nonvolatile memory cell array according to an aspect of the present invention includes: a step (a) of (i) forming a stacking structure by stacking, above a substrate, an interlayer insulating film, a first conductive layer, a semiconductor layer, and a second conductive layer, in parallel to a main surface of the substrate, and (ii) further forming one or more stacking structures each of which is a same as the stacking structure, in parallel to the main surface of the substrate; a step (b) of forming a plurality of strip-shaped trenches penetrating through the stacking structures in a stacking direction; a step (h) of simultaneously forming, by oxidizing a surface layer of a side face of the stacking structure exposed to a side face of each of the strip-shaped trenches, (i) a second variable resistance layer on a surface layer of a side face of the first conductive layer and (ii) an insulating film on the surface layer of the side face of each of the semiconductor layer and the second conductive layer; a step (d) of forming a contact hole by embedding a polysilicon in the strip-shaped trench and removing part of the polysilicon through etching; a step (i) of forming a first variable resistance layer on an inner wall of the contact hole, the first variable resistance layer having a resistance value that reversibly changes according to an application of an electric signal; a step (j) of forming a columnar electrode in the contact hole by embedding a conductive material in the contact hole, the columnar electrode being connected to the first variable resistance layer; a step (f) of removing a remnant of the polysilicon in the strip-shaped trench; and a step (g) of forming an insulating film by oxidizing the first conductive layer exposed to a space created by removing the remnant of the polysilicon in the strip-shaped trench.

Advantageous Effects of Invention

With the structure of a memory cell and a memory cell array according to the present invention, the variable resistance layer can be formed by performing oxidation process on part of a conductive layer after forming a contact hole, and thus it is possible to simplify the manufacturing procedures. In addition, it is easy to control the uniformity of a thickness, so that the reliability of the non-volatile memory cell array increases. In addition, it is possible to electrically isolate adjacent memory cells so as to suppress a crosstalk between the adjacent memory cells, using a series-connected diode.

BRIEF DESCRIPTION OF DRAWINGS

FIG. 2B is a cross-sectional diagram taken from the line A-A' of the non-volatile memory cell array according to Embodiment 2 of the present invention.

FIG. 2C is a cross-sectional diagram taken from the line B-B' of the non-volatile memory cell array according to Embodiment 2 of the present invention.

DESCRIPTION OF EMBODIMENTS

The following describes embodiments according to the present invention, with reference to the drawings.

Embodiment 1

Figure 1A:
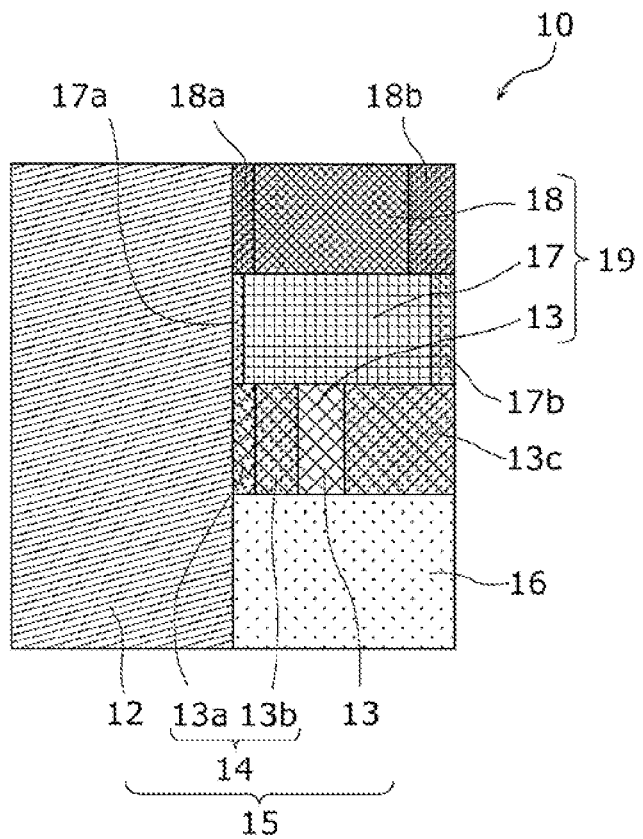
FIG. 1A is a cross-sectional diagram of a non-volatile as memory cell according to Embodiment 1 of the present invention.
Figure 1B:
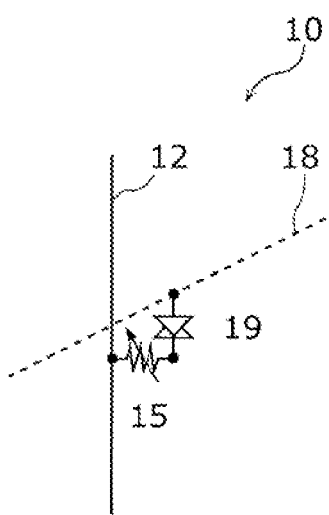
FIG. 1B is an equivalent circuit diagram of the non-volatile memory cell according to Embodiment 1 of the present invention.
Figure 1C:
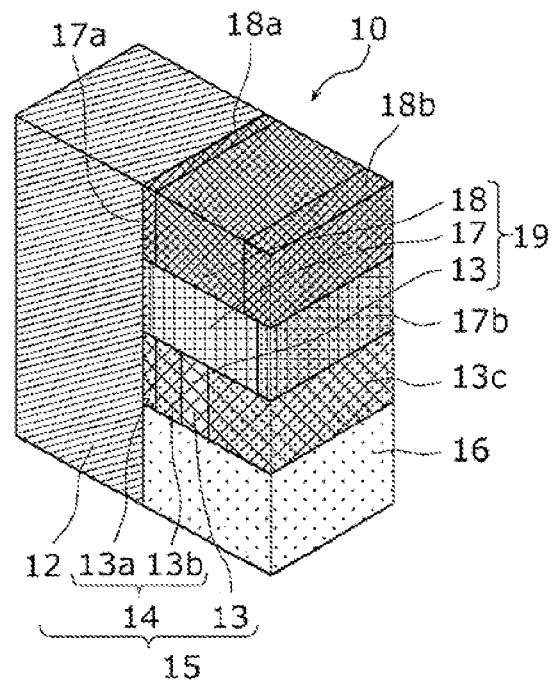
FIG. 1C is a perspective view of the non-volatile memory cell according to Embodiment 1 of the present invention.

FIG. 1A to FIG. 1C show a non-volatile memory cell 10 according to Embodiment 1 of the present invention. FIG. 1A is a cross-sectional diagram of the non-volatile memory cell 10, FIG. 1B is an equivalent circuit diagram of the non-volatile memory cell 10, and FIG. 1C is a perspective view of the non-volatile memory cell 10.

As shown in FIG. 1A and FIG. 1C, the non-volatile memory cell 10 includes: a columnar electrode 12; an interlayer insulating film 16; a variable resistance layer 14; a first conductive layer 13; and a semiconductor layer 17; and a second conductive layer 18. As part of the first conductive layer 13, the first variable resistance layer 13a, the second variable resistance layer 13b, and the insulating layer 13c are formed. The variable resistance layer 14 includes the first variable resistance layer 13a and the second variable resistance layer 13b. As part of the semiconductor layer 17 and the second conductive layer 18, insulating layers 17a, 17b, 18a, and 18b are formed.

The interlayer insulating film 16 is formed in parallel to a main surface of a substrate (not illustrated). The first conductive layer 13 is disposed in contact with the interlayer insulating film 16 in a stacking direction. The semiconductor layer 17 is disposed in contact with the first conductive layer 13 in the stacking direction. The second conductive layer 18 is disposed in contact with the semiconductor layer 17 in the stacking direction. The first conductive layer 13, the semiconductor layer 17, and the second conductive layer 18 may be stacked in order indicated in FIG. 1A and FIG. 1C, or may be stacked in the inverse order.

The columnar electrode 12, the variable resistance layer 14, and the first conductive layer 13 are included in the variable resistance element 15 in parallel with the main surface of the substrate. The first conductive layer 13, the semiconductor layer 17, and the second conductive layer 18 are included in a diode element 19 of an MSM (metal-semiconductor-metal) type having a bidirectional rectification property in a direction perpendicular to the main surface of the substrate. Accordingly, the non-volatile memory cell 10 is configured in which the variable resistance element 15 and the diode element 19 are connected to each other in series, as shown in the equivalent circuit diagram of FIG. 1B. It is to be noted that, in FIG. 1B, each of the columnar electrode 12 and the second conductive layer 18 is depicted as a line.

In the non-volatile memory cell 10, the variable resistance layer 14 is interposed between the columnar electrode 12 and the first conductive layer 13. In addition, the variable resistance layer 14 has a characteristic of changing between at least two states having different resistance values, and is capable of selectively causing a change from one state to another state. Thus, the non-volatile memory cell 10 is capable of selectively changing the resistance value between the columnar electrode 12 and the first conductive layer 13, by applying a driving voltage or a driving current between the columnar electrode 12 and the first conductive layer 13.

The variable resistance layer 14, typically, has two states; that is, a high resistance state having a relatively high electric resistance value and a low resistance state having a low electric resistance value. At this time, the non-volatile memory cell 10 changes from the high resistance state to the low resistance state, or from the low resistance state to the high resistance state, according to an application of a driving voltage or a driving current equal to or larger than a predetermined threshold.

The variable resistance layer 14 can be formed using a oxygen-deficient metal oxide. A constituent metal of the metal oxide is preferably a transition metal, such as tantalum (Ta), hafnium (Hf), titanium (Ti), tungsten (W), nickel (Ni), iron (Fe) and the like. Here, an oxygen-deficient metal oxide refers to a metal oxide having a smaller amount of oxygen content than a composition of a metal oxide having a stoichiometric composition (insulator, in general), and many of them generally behave like semiconductors. It is possible to stably cause a resistance change between binary resistance values with an excellent reproducibility, by using an oxygen-deficient oxide of the above-exemplified constituent metal as the variable resistance layer 14.

The oxygen content of the variable resistance layer 14 decreases from an interface between the variable resistance layer 14 and the columnar electrode 12, toward the first conductive layer 13. It is possible to form the variable resistance layer 14 through an oxidation process such that the oxygen content of the variable resistance layer 14 continuously decreases with distance from the columnar electrode 12. This is because that, in the oxidation process, the amount of oxygen entering an inside of the first conductive layer 13 decreases with distance from a contact hole. Among them, a layer having a higher oxygen content is the first variable resistance layer 13a and the layer having a lower oxygen content is the second variable resistance layer 13b.

In this case, since the oxygen content gradually decreases according to the distance from the surface on which the oxidation process is performed, the stacking structure is not defined as definitively as the stacking structure shown in FIG. 1A. However, since it is important that the oxygen content of the region of the first variable resistance layer 13a is larger than the oxygen content of the second variable resistance layer 13b, the stacking structure is used for illustration so as to be easily understood.

In addition, it is also possible to further clarify the difference between the oxygen content of the first variable resistance layer 13a and the oxygen content of the second variable resistance layer 13b by performing the oxidation process twice under different conditions.

It is estimated that the first variable resistance layer 13a receives an oxygen ion from the second variable resistance layer 13b in response to an application of a positive driving voltage or a driving current (a current flows in the direction from the first variable resistance layer 13a to the second variable resistance layer 13b) and changes to the high resistance state. On the other hand, it is estimated that the first variable resistance layer 13a diffuses the received oxygen ion to the second variable resistance layer 13b in response to an application of a negative driving voltage or a driving current and changes to the low resistance state.

It is to be noted that the first variable resistance layer 13a may change to the low resistance state only in part of the region of the first variable resistance layer 13a. For the details of the role of the second variable resistance layer as described above and the experimental data that is the basis thereof, the invention described in WO 2008/149484 (Patent Literature 4) filed by the Applicant of the present application should be referred to.

It is to be noted that the variable resistance layer 14 is not limited to having two layers. In order to trigger resistance changing phenomenon in the variable resistance layer 14 composed of one layer, a forming process may be performed on the variable resistance layer 14. The forming process is a process of applying, once or plural times, a positive or negative voltage higher than a voltage applied during a normal operation, to the variable resistance layer 14, in order to electrically form a layer having a large amount of oxygen content near the interface to which the positive voltage is applied.

For the first conductive layer 13, an oxygen-deficient metal oxide having less oxygen content (in resistivity, for example, equal to or less than 10 mΩ·cm) or a metal which does not include oxygen may be used. In the former case, there is an advantage that the variable resistance layer 14 is easily formed from the first conductive layer 13. In the latter case, there is an advantage that resistance of the first conductive layer 13 decreases and thus power consumption can be reduced.

The semiconductor layer 17 comprises $SiN_y$, for example. $SiN_y$ is a so-called silicon nitride and the value of y indicates the degree of nitriding (composition ratio); however, the electrical conduction property of $SiN_y$ changes significantly according to the value of y. More specifically, $SiN_y$ is an insulator in terms of a so-called stoicheiometric composition (y=1.33, that is, $Si_3N_4$); however, $SiN_y$ gradually changes to behave as a semiconductor when the nitrogen ratio decreases (in other words, when the value of y is reduced). Amorphous Si or other semiconductor materials may be used for the semiconductor layer 17.

Each of the first conductive layer 13 and the second conductive layer 18 is a material to form a Schottky junction by being in contact with the semiconductor layer 17. The MSM diode includes the first conductive layer 13, the semiconductor layer 17, and the second conductive layer 18.

The second conductive layer 18 may comprise TiN, TaN, or the like.

For example, an MSM diode in which the first conductive layer 13 comprises $TaO_x$, the semiconductor layer 17 comprises $SiN_y$, and the second conductive layer 18 comprises TaN has a bidirectional rectification property for the applied voltage and provides a current steering element having a large breakdown current. The MSM diode can also easily create a non-volatile memory device and a non-volatile memory apparatus with high reliability, by combining a diode element and the variable resistance element.

The variable resistance layer 14 is formed by (i) stacking the first conductive layer 13, the semiconductor layer 17, and the second conductive layer 18 in this order above the interlayer insulating film 16, (ii) forming a contact hole that penetrates through a stacked body including the first conductive layer 13, the semiconductor layer 17, and the second conductive layer 18, and the interlayer insulating film 16 in the stacking direction, and then (iii) performing oxidation process on part of the first conductive layer 13 exposed in the contact hole.

Accordingly, the step of embedding a material into the contact hole includes only one step of embedding the columnar electrode 12, and thus it is possible to simplify the manufacturing procedures. In addition, by forming the variable resistance layer 14 through the oxidation process, there is an advantage that it is easy to control the thickness of the variable resistance layer 14.

Furthermore, part of the $SiN_y$ layer of the semiconductor layer 17 exposed to the contact hole is oxidized simultaneously with the oxidation of the first conductive layer 13, an insulating layer 17a comprising $SiO_2$ is formed on the surface, the semiconductor layer 17 is insulated from the columnar electrode 12. In addition, part of the TaN, TiN, and the like of the second conductive layer 18 exposed to the contact hole is simultaneously oxidized, an insulating layer 18a comprising TaON, TiON, and the like is formed, and the second conductive layer 18 is insulated from the columnar electrode 12.

The columnar electrode 12 may comprise a material which excels in conductivity (in resistivity, for example, equal to or less than 10 mΩ·cm) and of which the major metal material has a standard electrode potential that is higher than a standard electrode potential of a metal included in the variable resistance layer 14. Specific examples of the material of the columnar electrode 12, for the material of the above-described variable resistance layer, include: platinum (Pt), iridium (Ir), palladium (Pd), copper (Cu), tungsten (W) (excepting the case where the variable resistance layer is a tungsten oxide), and so on. It is to be noted that the columnar electrode 12 may include a thin film formed of the above-exemplified material on an outer periphery of the conductive body comprising tungsten (W) or the like.

The reason why it is preferable that the standard electrode potential of the metal used for the columnar electrode 12 is higher than the standard electrode potential of the metal used for the first conductive layer 13 and the variable resistance layer 14 is that, with this, since the columnar electrode 12 becomes difficult to be oxidized by the variable resistance layer 14, oxidation-reduction reaction of the variable resistance layer 14 mainly occurs near the interface between the columnar electrode 12 and the variable resistance layer 14, the oxygen content of the first variable resistance layer 13a changes, thereby stabilizing resistance changing phenomenon.

As described above, according to the configuration of Embodiment 1, the variable resistance layer 14 is formed in one oxidation process and, at the same time, an insulating film for electrically isolating each of the semiconductor layer 17 and the second conductive layer 18 from the columnar electrode 12, and thus it is possible to simplify the is manufacturing procedures. In addition, the uniformity of the thickness of the variable resistance layer can easily be controlled, so that the reliability of the non-volatile memory cell array increases.

Modification of Embodiment 1

The following describes a non-volatile memory cell according to a modification of Embodiment 1 of the present invention.

Figure 1D:
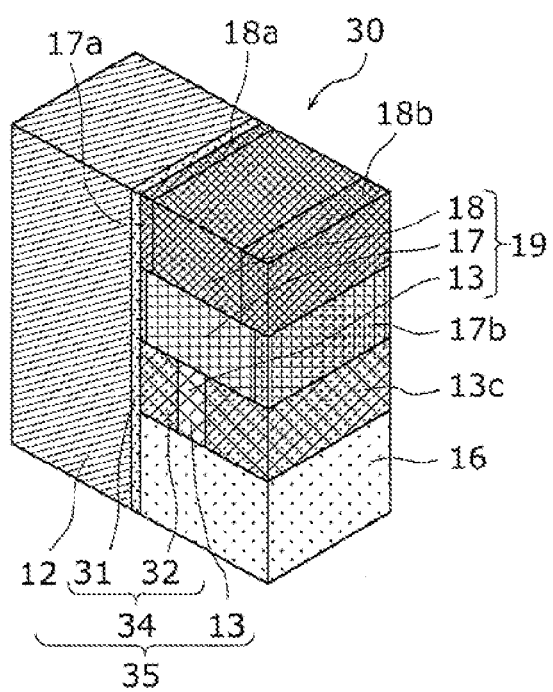
FIG. 1D is a perspective view of a non-volatile memory cell according to a modification of Embodiment 1 of the present invention.

FIG. 1D is a diagram showing an example of a structure of a non-volatile memory cell 30 according to a modification of Embodiment 1 of the present invention.

As shown in FIG. 1D, in the non-volatile memory cell 30, the variable resistance element 15 included in the non-volatile memory cell 10 of FIG. 1C is replaced with a variable resistance element 35 including a variable resistance layer 34 comprising a first variable resistance layer 31 and a second variable resistance layer 32.

In the non-volatile memory cell 30, the columnar electrode 12, the variable resistance layer 34, and the first conductive layer 13 are included in the variable resistance element 35 in parallel with the main surface of the substrate. The first conductive layer 13, the semiconductor layer 17, and the second conductive layer 18 are included in a diode element 19 of an MSM type having a bidirectional rectification property in a direction perpendicular to the main surface of the substrate.

The non-volatile memory cell 30 shares characteristics with the non-volatile memory cell 10 in that the variable resistance layer 34 is provided between the columnar electrode 12 and the first conductive layer 13, the variable resistance element 35 is disposed in parallel with the main surface of the substrate, and the diode element 19 is disposed perpendicular to the main surface of the substrate. With these common characteristics, the non-volatile memory cell 30 and the non-volatile memory cell 10 have the advantages described below.

Each of the variable resistance elements 15 and 35 has a resistance value that changes due to a change in a filament (conductive path) in each of the variable resistance layers 14 and 34. Thus, the higher voltage or the denser current is applied to the variable resistance layers 14 and 34, the more likely the resistance value changes. It is preferable, therefore, that an area of each of the variable resistance elements 15 and 35 is small. Here, the area refers to an area of a surface perpendicular to the direction of applying a voltage.

On the other hand, since the diode element 19 causes a large current (for example, at least 10000 A/cm$^2$) to flow through the variable resistance elements 15 and 35, it is preferable that the current capacity is large. The current capacity of the diode increases depending on the size of the junction area of the diode, and thus it is preferable that the area of the diode element 19 is large.

Therefore, in the non-volatile memory cells 10 and 30 according to the present embodiment and the modification thereof, since the direction of applying a voltage to the variable resistance elements 15 and 35 is different from the direction of applying a voltage to the diode element 19, it is possible to reduce the area of the variable resistance elements 15 and 35 on one hand and to increase the area of the diode element 19 on the other hand. In addition, since the area of each of the variable resistance elements 15 and 35 is defined by the thickness of the first conductive layer 13 stacked horizontally with respect to the main surface of the substrate, it is possible to make the area of each of the variable resistance elements 15 and 35 equal to or less than a minimum fabrication size, for example.

On the other hand, the non-volatile memory cell 30 is different from the non-volatile memory cell 10 in that the first variable resistance layer 31 is formed to be in contact with a side face of the columnar electrode 12 and to cover the side face, and the second variable resistance layer 32 is formed exclusively at an intersection of the first variable resistance layer 31 and the first conductive layer 13.

The non-volatile memory cell 30 can be manufactured, in the same manner as the manufacturing steps of the non-volatile memory cell 10, by forming a contact hole for embedding the columnar electrode 12 and then embedding the first variable resistance layer 31 and the columnar electrode 12 in this order in the contact hole.

Accordingly, the step of embedding a material into a contact hole is composed of two steps; that is, embedding of the first variable resistance layer 31 and embedding of the columnar electrode 12, and thus it is possible to separate the step of forming the first variable resistance layer 31 from the step of forming the second variable resistance layer 32. As a result, with the non-volatile memory cell 30, although there is a slight decrease in the simplification of the manufacturing procedures and the controllability of the thickness of the variable resistance layer 34 compared to the non-volatile memory cell 10, it is possible to obtain an advantage that flexibility in selecting a material for the first variable resistance layer 31 and the second variable resistance layer 32 increases.

Therefore, it is possible to freely select a combination of the first variable resistance layer 31 and the second variable resistance layer depending on a desired variable resistance characteristic, an oxidation characteristic, and so on. It is possible to use, for example, at least one material having a high resistivity selected from a titanium oxide (TiO$_2$, for example), a hafnium oxide (HfO$_y$), an aluminum oxide (AlO$_y$), and the like, for the first variable resistance layer 31, and to use a tantalum oxide (TaO$_x$) having a lower resistance value than a resistance value of the first variable resistance layer 31 for the second variable resistance layer 32.

In the non-volatile memory cell 30, transition metal oxides of different types can be used for the first variable resistance layer 31 and the second variable resistance layer 32, for example. In this case, a transition metal oxide having a lower degree of oxygen deficiency than a degree of oxygen deficiency of a transition metal oxide of the second variable resistance layer 32 is used for the first variable resistance layer 31. The degree of oxygen deficiency is a ratio of deficient oxygen to the amount of oxygen included in the stoichiometric oxide in each of the transition metals.

When the transition metal is tantalum (Ta), for example, the composition of the stoichiometric oxide is $Ta_2O_5$, and thus it can be denoted as $TaO_{2.5}$. The degree of oxygen deficiency of $TaO_{2.5}$ is 0%. The degree of oxygen deficiency of the oxygen-deficient tantalum oxide whose composition is represented as $TaO_{1.5}$ is expressed as follows: the degree of oxygen deficiency=(2.5−1.5)/2.5=40%. In addition, the oxygen content atomic percentage of $Ta_2O_5$ is the ratio of oxygen to a total number of atoms (O/(Ta+0)); that is 71.4 atm %. Accordingly, the oxygen content atomic percentage of the oxygen-deficient tantalum oxide is larger than 0 and smaller than 71.4 atm %.

Among the transition metal oxides having the same constituent metal, the degree of oxygen deficiency is smaller as the oxygen content atomic percentage (oxygen content) is larger, and the degree of oxygen deficiency is larger as the oxygen content atomic percentage (oxygen content) is smaller. In the description below, the degree of oxygen deficiency is used instead of the above-described oxygen content, as a measure for uniformly comparing the deficient degrees of oxidation of the transition metal oxides irrespective of the types of the constituent metals.

A transition metal oxide having a degree of oxygen deficiency smaller than a degree of oxygen deficiency of a transition metal oxide of the second variable resistance layer 32 is used for the first variable resistance layer 31, so that a larger amount of voltages, among voltages applied between the first conductive layer 13 and the columnar electrode 12 during the resistance change, are distributed to the first variable resistance layer 31 of the variable resistance layer 34, thereby facilitating oxidation-reduction reaction occurring in the first variable resistance layer 31 of the variable resistance layer 34. In addition, in the case where transition metals different from each other are used for the first variable resistance layer 31 and the second variable resistance layer 32, it is preferable that the standard electrode potential of the transition metal of the first variable resistance layer 31 is lower than the standard electrode potential of the transition metal of the second variable resistance layer 32. The reason is because the resistance changing phenomenon is considered to occur as a result of a change in a resistance value caused by the oxidation-reduction reaction in a minute filament (conductive path) formed in the transition metal oxide layer of the first variable resistance layer 31 having a high resistance.

It is possible to obtain a stable resistance change by, for example, using an oxygen-deficient tantalum oxide formed by oxidation of the first conductive layer 13 for the transition metal oxide of the second variable resistance layer 32 and using titanium oxide ($TiO_2$) for the transition metal oxide of the first variable resistance layer 31. Titanium (standard electrode potential=−1.63 eV) is a material having a lower standard electrode potential than a standard electrode potential of tantalum (standard electrode potential=−0.6 eV). With a larger value of the standard electrode potential, the material is less likely to oxidize. The oxidation-reduction reaction is facilitated in the transition metal oxide of the first variable resistance layer 31, by providing, as the transition metal oxide of the first variable resistance layer 31, a transition metal oxide having a lower standard electrode potential than a standard electrode potential of a transition metal oxide of the second variable resistance layer 32.

In addition, it is preferable that the columnar electrode 12 of the non-volatile memory cell 30 comprises a material of which a standard electrode potential of a major metal material is higher than a standard electrode potential of a metal comprised by the first variable resistance layer 31. This is based on the same concept as the non-volatile memory cell 10. More specifically, since the columnar electrode 12 formed as described above is more difficult to oxidize than the first variable resistance layer 31, oxidation-reduction reaction of the first variable resistance layer 31 mainly occurs near the interface of the columnar electrode 12 and the first variable resistance layer 31, and the oxygen content of the first variable resistance layer 31 changes, thereby stabilizing the resistance changing phenomenon.

Embodiment 2

Figure 2A:
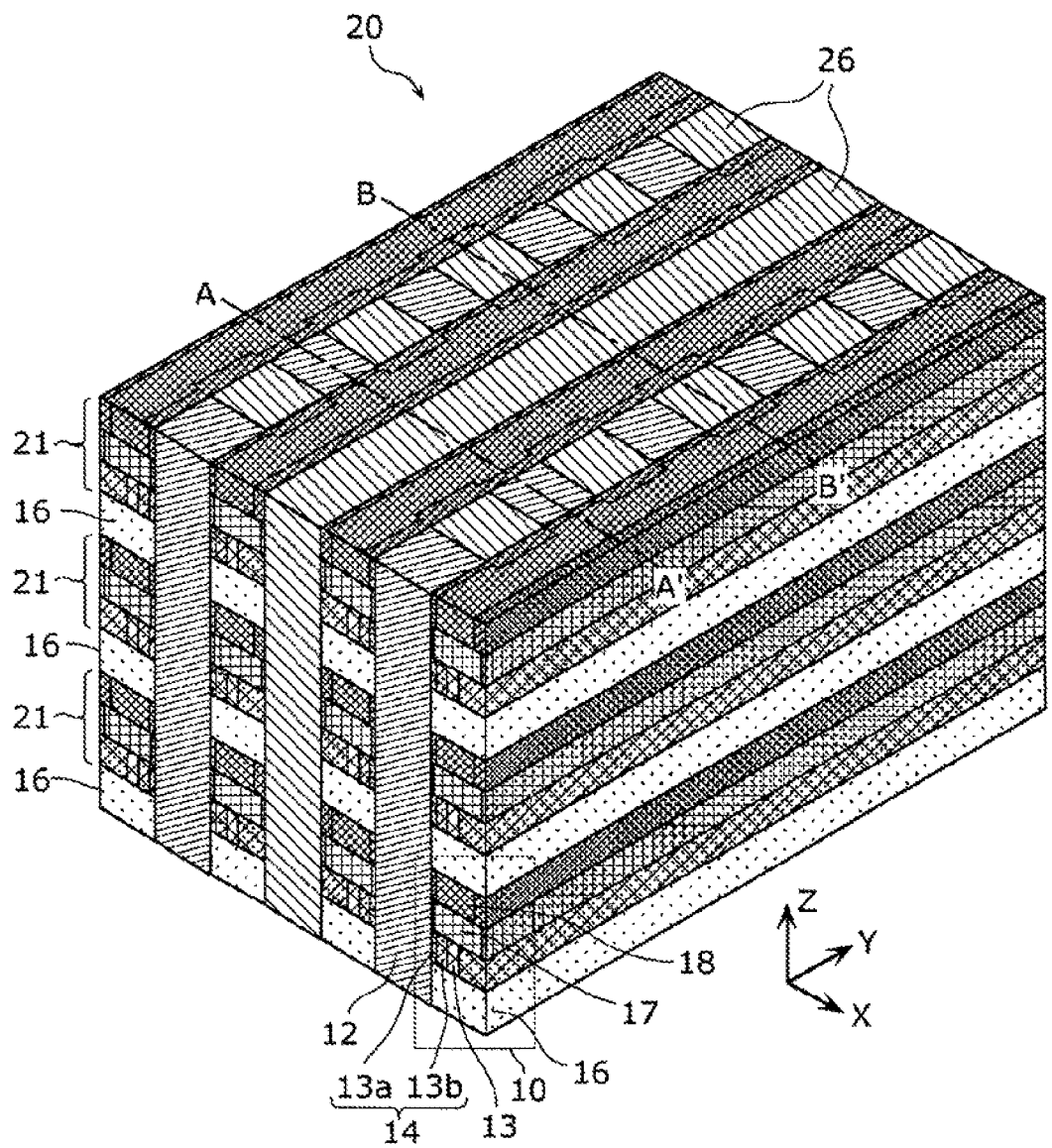
FIG. 2A is a perspective view of a non-volatile memory cell array according to Embodiment 2 of the present invention.
Figure 3:
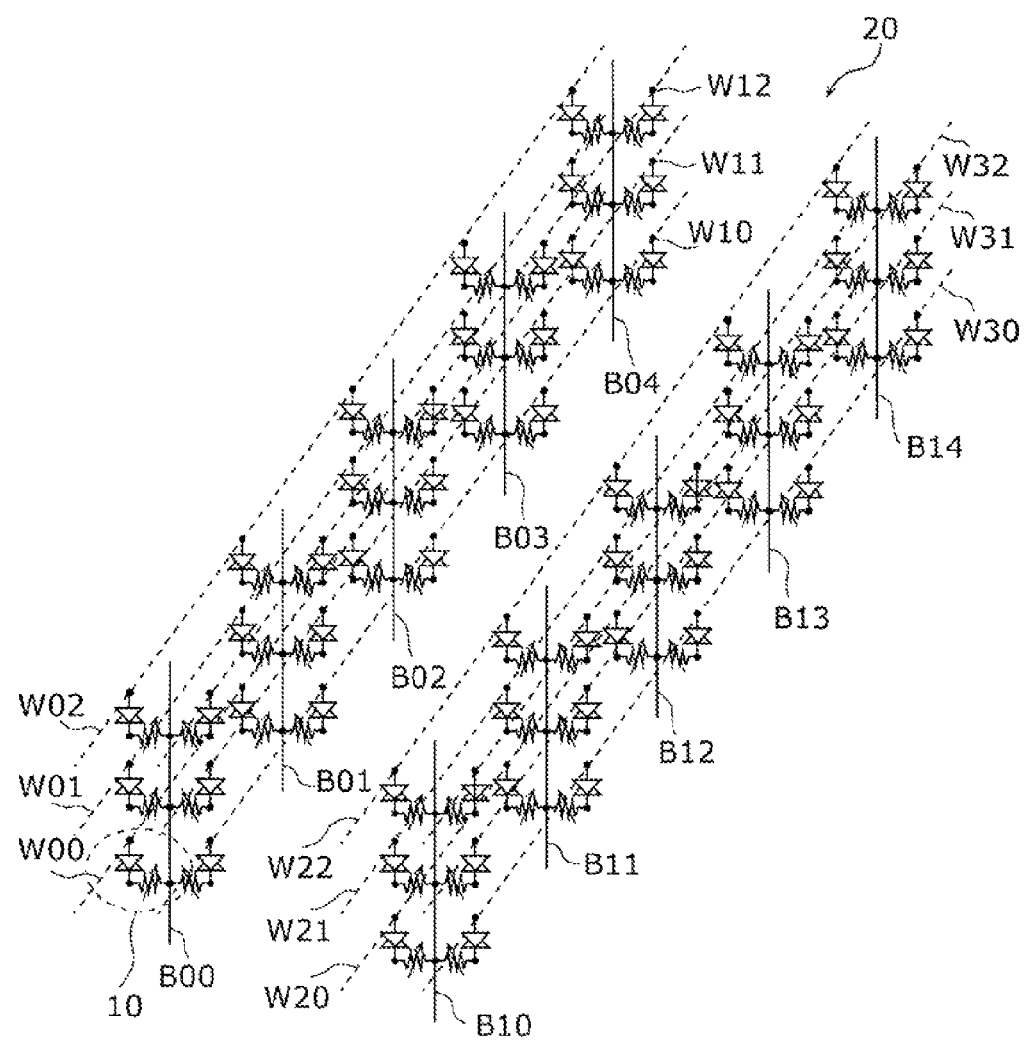
FIG. 3 is an equivalent circuit diagram of the non-volatile memory cell array according to Embodiment 2 of the present invention.

FIG. 2A to FIG. 2C, and FIG. 3 show an example of a non-volatile memory cell array 20 according to Embodiment 2 of the present invention. FIG. 2A is a perspective view of the non-volatile memory cell array 20. FIG. 2B and FIG. 2C are cross-sectional diagrams of the non-volatile memory cell 20 taken from the line A-A' and the line B-B', respectively, in the perspective view of the non-volatile memory cell array 20. FIG. 3 is an equivalent circuit diagram of the non-volatile memory cell array 20. In the description below, an explanation will be given in line with the directions of X, Y, and Z shown by arrows in the diagram.

As shown in FIG. 2A, the non-volatile memory cell array 20 is a memory cell array in which three interlayer insulating films 16 and three stacked bodies 21 are alternately arranged in the Z direction (direction perpendicular to the substrate), each of the stacked bodies 21 includes 20 memory cells (four in the X direction×five in the Y direction), and a total of 60 memory cells are three-dimensionally arranged. The non-volatile memory cell array 20 is formed above a substrate (not illustrated) including a main surface that is parallel to in the XY face.

Here, each of the memory cells corresponds to the non-volatile memory cell 10 according to Embodiment 1, and includes: a columnar electrode 12; an interlayer insulating film 16; a first conductive layer 13; a variable resistance layer 14 having a first variable resistance layer 13a and a second variable resistance layer 13b; a semiconductor layer 17; and a second conductive layer 18.

The non-volatile memory cell 10 is represented in the cross-sectional diagram of FIG. 2B. In addition, in the cross-sectional diagram of FIG. 2C, the columnar electrode 12 is not included and the first conductive layer 13 is oxidized over the entire width in the X direction to be an insulating layer 13c. Thus, the cross-sectional structure shown in FIG. 2C serves as element isolation for isolating the non-volatile memory cells 10 adjacent to each other in the Y direction.

With the non-volatile memory cell array 20, in the same manner as Embodiment 1, since the variable resistance layer 14 is formed by performing an oxidation process on part of the first conductive layer 13 after forming a contact hole, it is possible to simplify the manufacturing procedures. In addition, since the variable resistance layer 14 is formed exclusively at an intersection of the columnar electrode 12 and the first conductive layer 13, it is possible to implement a memory cell array in which the variable resistance layer 14 is isolated for each memory cell. Furthermore, compared to the variable resistance layer formed by embedding, the thickness of the variable resistance layer 14 formed by the oxidation process can be controlled uniformly over a plurality of variable resistance layers 14 in the contact hole. Thus, the reliability of the non-volatile memory cell array 20 of the stacking structure improves.

As shown in FIG. 2A, the interlayer insulating films 16 and the stacked bodies 21 each of which includes the first conductive layer 13, the semiconductor layer 17, and the second conductive layer 18, are in alternately stacked in parallel with the main surface of the substrate. Here, each of the columnar electrodes 12 has a columnar shape perpendicular to the main surface of the substrate, disposed at positions distributed in matrix on the main surface of the substrate (in other words, distributed in array in the X direction and in the Y direction), and serves as a bit line. In addition, each of the second conductive layers 18 serves as a word line.

In addition, the insulating layer 26 which has a planer shape and is disposed at a Y-Z plane in the center portion in FIG. 2A divides, at the center of the non-volatile memory cell array 20, the memory cells 10 arranged in each row four by four in the row (X) direction, into two groups each including two of the memory cells 10. More specifically, in FIG. 2A, the columnar electrodes 12 of the memory cell 10 positioned at both sides of the insulating layer 26 provided at the Y-Z plane in the center is isolated from each other by the insulating layer 26.

In the non-volatile memory cell array 20, such a structure is repeatedly provided in the X direction, thereby allowing reduction of a sneak current that passes through an unselected bit line, an unselected word line, and an unselected memory cell.

FIG. 3 is an equivalent circuit diagram of the non-volatile memory cell array 20 according to Embodiment 2. In FIG. 3, the non-volatile memory cell 10 is provided at a crosspoint of the columnar electrode 12 (bit line: B00, B01, . . . , B11, . . . ) and the second conductive layer 18 (word line: W00, W01, . . . , W30, W31, . . . ). More specifically, the state of a resistance value of the non-volatile memory cell 10 can be changed by selecting a bit line (B00, for example) and a word line (W00, for example) and applying a driving voltage to the non-volatile memory cell 10 positioned at a crosspoint thereof. Accordingly, when assigning information in association with the state of the resistance value of the non-volatile memory cell 10, it is possible to write information to or read information from the non-volatile memory cell 10 by applying a driving voltage to the bit line and the word line each of which is connected to the non-volatile memory cell 10. As a result, it is possible to implement the non-volatile memory cell array 20 that has random access capability.

In addition, as described above, the memory cell array including the bit lines B00 to B04 and the word lines W00 to W12 are completely separated in a line level from the memory cell array including the bit lines B10 to B14 and the word lines W20 to W32, and thus it is possible to reduce a sneak current.

The following describes a manufacturing method of the non-volatile memory cell array according to Embodiment 2 with reference to FIG. 4 to FIG. 14.

Figure 4:
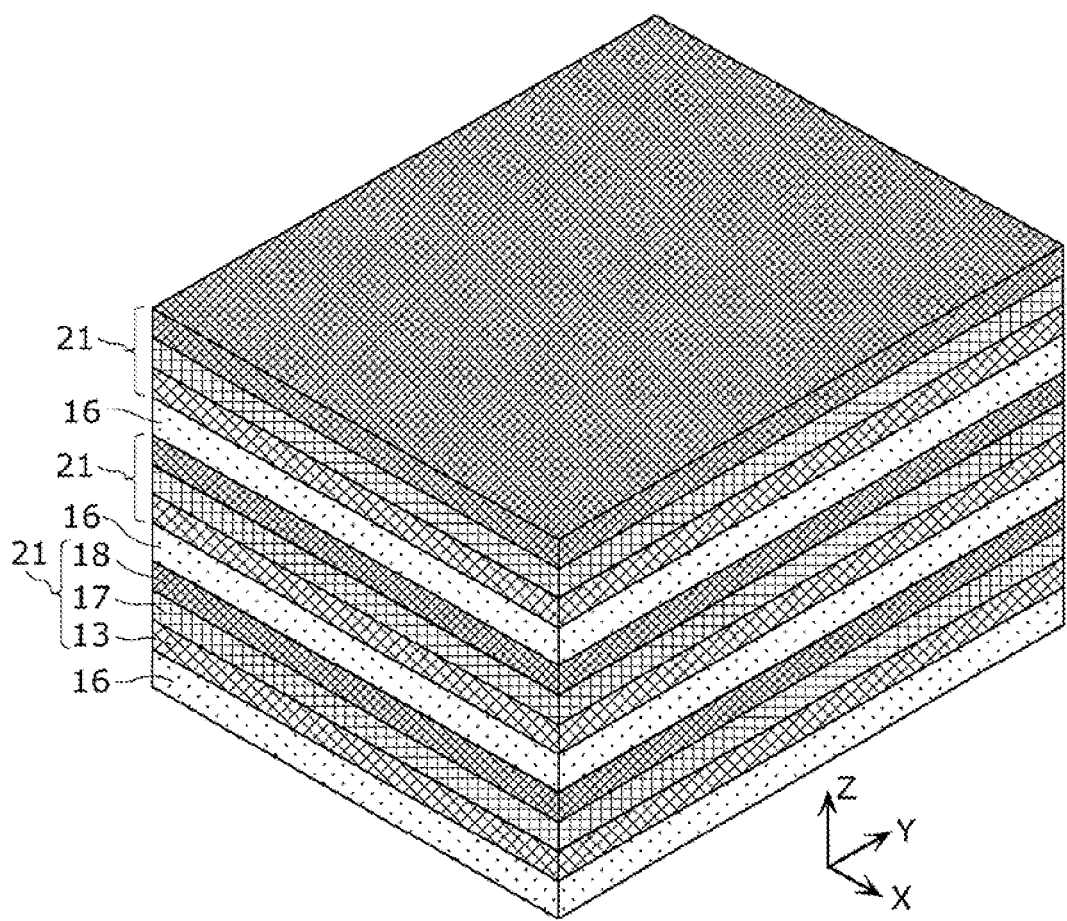
FIG. 4 is a perspective view of the non-volatile memory cell array in a manufacturing step according to Embodiment 2 of the present invention.

First, in the step shown in FIG. 4, the interlayer insulating films 16 and the stacked bodies 21 are alternately stacked above a substrate (not illustrated) in parallel with the main surface of the substrate. Each of the stacked bodies 21 includes the first conductive layer 13, the semiconductor layer 17, and the second conductive layer 18. With the stacking structure shown in FIG. 4, the stacked body 21 includes three layers. However, the number of layers included in the stacked body 21 is not particularly limited to this.

In the step shown in FIG. 4, tantalum (Ta) or an oxygen-deficient tantalum oxide $TaO_x$ (resistivity is equal to or less than 10 mΩ·cm) is deposited as the first conductive layer 13 through sputtering, for example, and silicon nitride $SiN_y$ is deposited as the semiconductor layer 17 through sputtering. In addition, tantalum nitride (TaN) is deposited as the second conductive layer 18 through sputtering. In each sputtering, reactive sputtering which introduces oxygen or nitrogen during sputtering may be used.

In addition, the interlayer insulating film 16 may be formed further above the second conductive layer 18 in the topmost layer.

Figure 5:
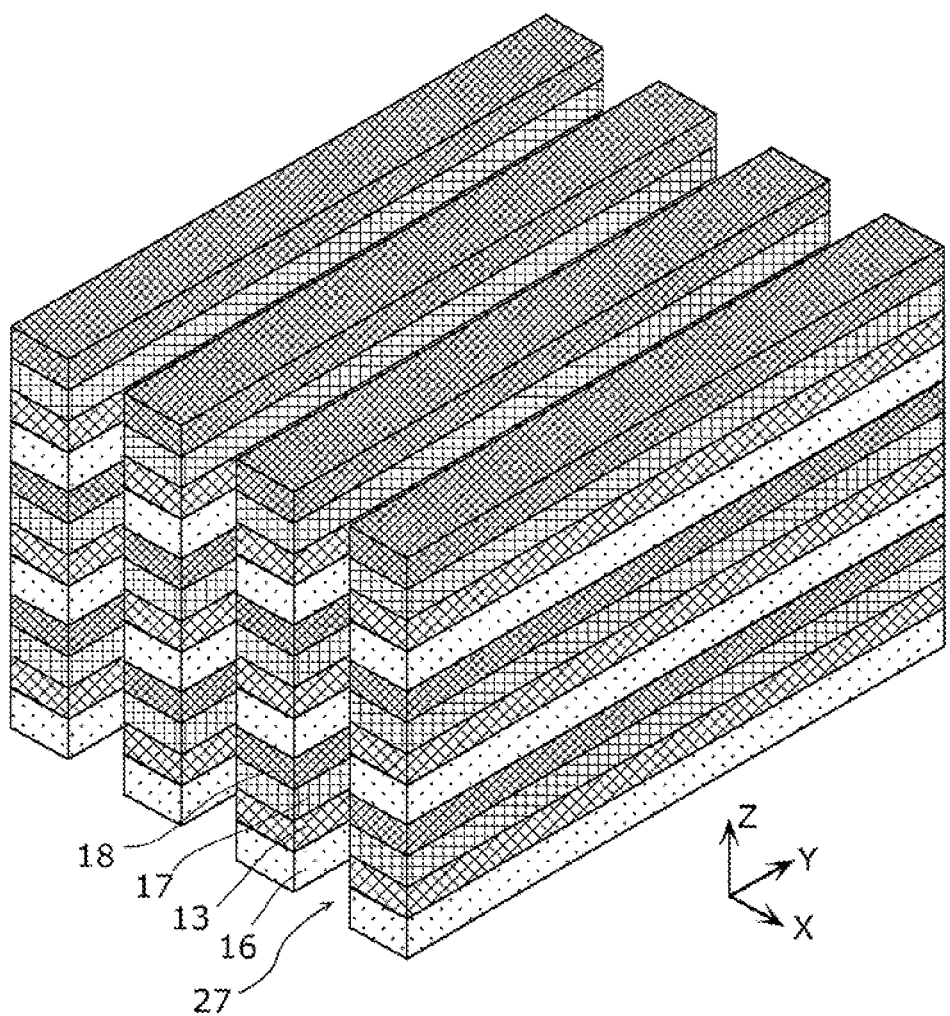
FIG. 5 is a perspective view of the non-volatile memory cell array in a manufacturing step according to Embodiment 2 of the present invention.

Next, in the step shown in FIG. 5, a strip-shaped trench 27 is formed along the Y-Z direction perpendicular to the main surface of the stacking structure.

In the step shown in FIG. 5, first, a mask pattern having a predetermined pattern shape is formed though general exposure process and development process. Next, the stacking structure is etched using the mask pattern to form the strip-shaped trench 27. Then, the mask pattern is removed. Through the steps described above, a side face of each of the interlayer insulating film 16, the first conductive layer 13, the semiconductor layer 17, and the second conductive layer 18 is exposed to the strip-shaped trench 27.

Figure 6:
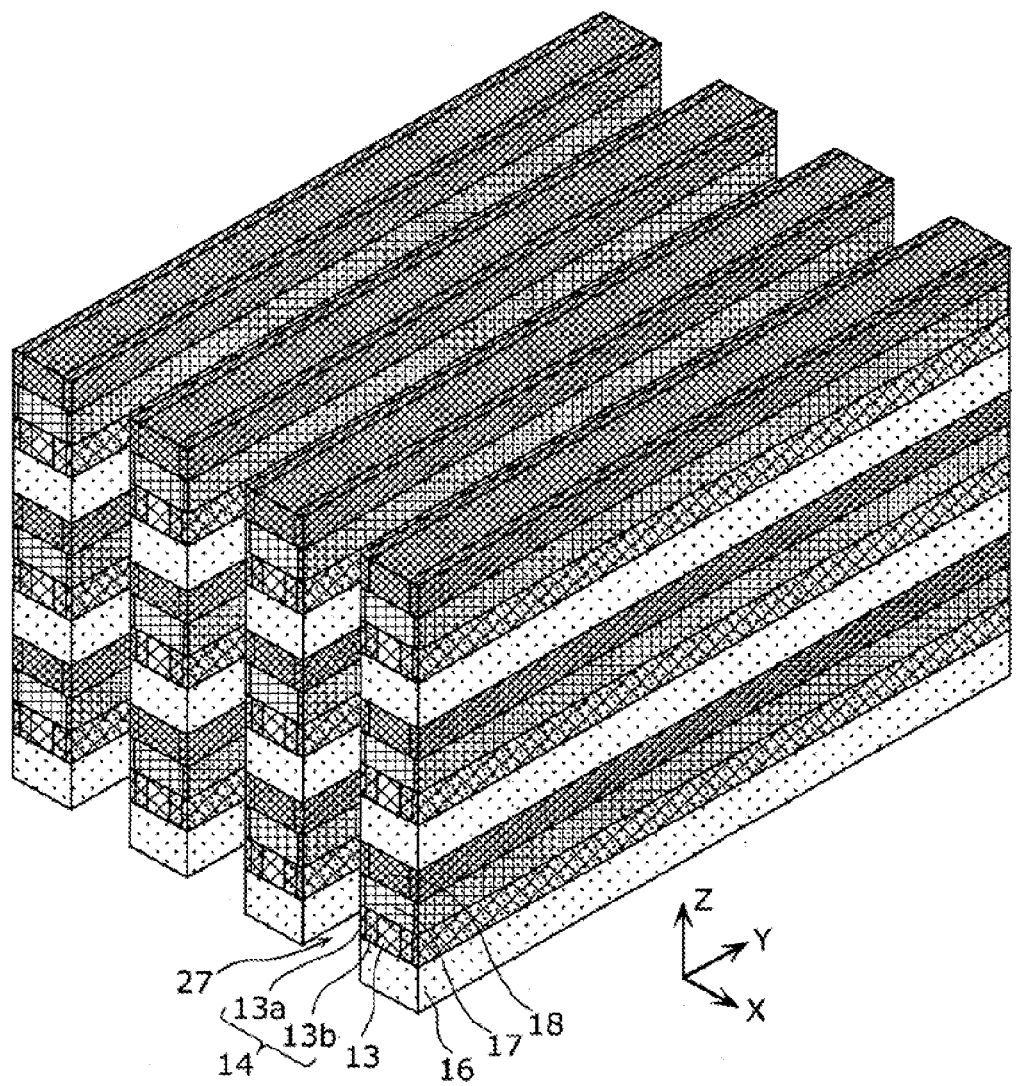
FIG. 6 is a perspective view of the non-volatile memory cell array in a manufacturing step according to Embodiment 2 of the present invention.

Next, in the step shown in FIG. 6, oxidation process is performed on the side face of each of the interlayer insulating film 16, the first conductive layer 13, the semiconductor layer 17, and the second conductive layer 18, from the surface exposed to the strip-shaped trench 27. At this time, the variable resistance layer 14 is formed by oxidizing the side face of the first conductive layer 13.

In the step shown in FIG. 6, a plasma oxidation process is performed in an oxygen atmosphere with 1100 W of an application power for 30 seconds of processing time, for example. Active oxygen, oxygen ions, or oxygen atoms diffuse from the surface of the first conductive layer 13 exposed to the strip-shaped trench 27 toward an inside of the first conductive layer 13. Due to these oxygen species, an oxide is formed which has a profile of a predetermined degree of oxygen deficiency in a region having a certain thickness from the surface exposed to the strip-shaped trench 27 toward the inside of the first conductive layer 13. The profile of the degree of oxygen deficiency is high near the surface and continuously decreases toward the inside.

In this plasma oxidation process, the variable resistance layer 14 is formed to have a thickness of approximately 10 nm from the surface exposed to the strip-shaped trench 27. In the variable resistance layer 14, the first variable resistance layer 13a having a lower degree of oxygen deficiency is formed in a region including approximately 2 to 3 nm from the surface, and the second variable resistance layer 13b having a higher degree of oxygen deficiency is formed in a region including approximately 7 to 8 nm from the first variable resistance layer 13a.

The plasma oxidation process is performed in an oxygen atmosphere according to the processes to form the variable resistance layer 14 as described above; however, the present invention is not limited to this. For example, heating treatment (hereinafter referred to as a thermal oxidation process) under an atmosphere including oxygen may be performed. The thermal oxidation process and the plasma oxidation process as described above are collectively called an oxidation process in the description below. In this manufacturing method, since the variable resistance layer 14 is formed by performing oxidation process on part of the first conductive layer 13, it is possible to simplify the conventional manufacturing procedures including the steps of embedding conductive layers. In addition, thickness control is easily conducted through the oxidation process compared to the embedding process, and thus the variable resistance layers 14 exposed to the strip-shaped trench 27 are formed to be uniform in thickness.

In addition, the oxidation process is not limited to be performed once. It is also possible to further clarify the difference between the degree of oxygen deficiency of the first variable resistance layer 13a and the degree of oxygen deficiency of the second variable resistance layer 13b by performing oxidation processes in two steps. For example, after weakly oxidizing part of the first conductive layer 13 over a wide range through a weak oxidation process, only the surface of the first conductive layer 13 exposed to the strip-shaped trench 27 is strongly oxidized through a strong oxidation process. Through these processes, the stacking structures of the first variable resistance layer 13a having a high resistance value and the second variable resistance layer 13b having a low resistance value are more clearly defined. It is to be noted that the oxidation process may be performed more than once to more accurately control the degree of oxygen deficiency of the variable resistance layer 14.

Sidewalls of the semiconductor layer 17 and the second conductive layer 18 are oxidized simultaneously with the oxidation process of the first conductive layer 13, and the insulating layers 17a, 17b, 18a, and 18b are formed on the surface exposed to the strip-shaped trench 27.

Figure 7:
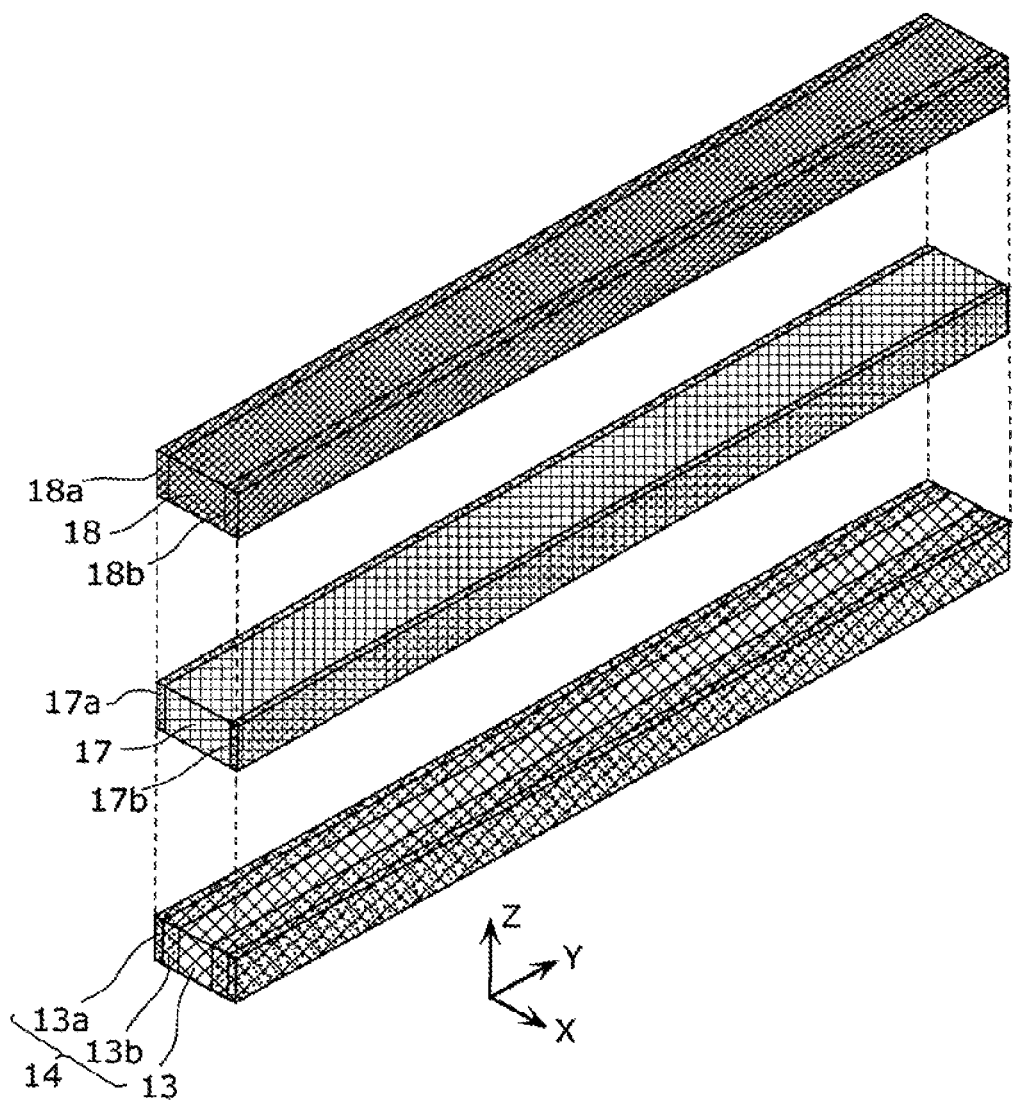
FIG. 7 is an exploded perspective view of a main section of the non-volatile memory cell array in a manufacturing step according to Embodiment 2 of the present invention.

FIG. 7 is an exploded perspective view which shows an example of a shape of each of the first conductive layer 13, the semiconductor layer 17, and the second conductive layer 18 after the plasma oxidation process is performed under the above-described conditions.

In this example, approximately 10 nm of $TaO_x$ that is the first conductive layer 13 is oxidized from the surface. An oxidized portion of the first conductive layer 13 serves as the first variable resistance layer 13a and the second variable resistance layer 13b.

Approximately 2 to 3 nm of $SiN_y$ that is the semiconductor layer 17 is oxidized from the surface to be $SiO_2$ that includes nitrogen and is an insulator. An oxidized portion of the semiconductor layer 17 serves as the insulating layers 17a and 17b.

Approximately 5 nm of TaN that is the second conductive layer 18 is oxidized from the surface to be TaON that is an insulator. An oxidized portion of the second conductive layer 18 serves as the insulating layers 18a and 18b.

As described above, even when the same oxidation process is performed, each of the first conductive layer 13, the semiconductor layer 17, and the second conductive layer 18 is oxidized in a portion that is different in size from each other, due to the difference in the respective materials.

Figure 8:
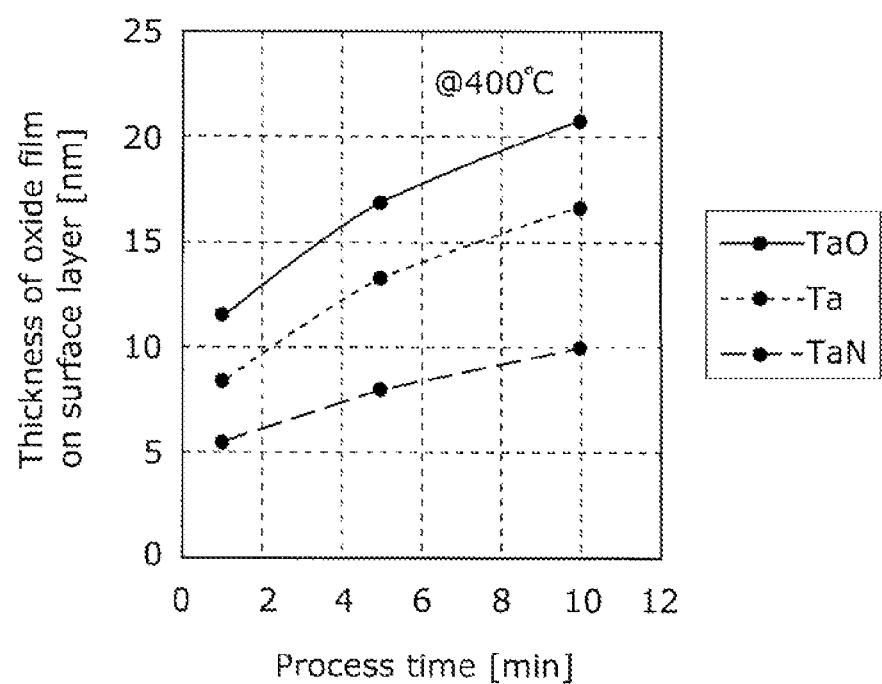
FIG. 8 is a graph which shows a progression rate of oxidation of a material used for the non-volatile memory cell array according to Embodiment 2 of the present invention.

FIG. 8 is a graph which shows a rate of oxidation progression of each of the materials of TaO, Ta, and TaN. The graph shows a period of time in which an oxidation process is performed, on each of the materials, in the oxygen atmosphere at 400 degrees Celsius, and a thickness of the oxide film (rate of oxidation progression) formed on a surface layer of each of the materials as a result of the oxidation process. This graph is based on a result of experiment preliminarily carried out in order to find out preferable conditions for the oxidation process.

As shown in the graph, oxidation of $TaO_x$ that is the material of the first conductive layer 13 progresses at a rate more than twice higher than TaN that is the material of the second conductive layer 18. This is consistent with the example of a shape shown in FIG. 7.

The difference in the progression rate of oxidation between the first conductive layer 13 and the second conductive layer 18 has an important meaning also in the oxidation process for providing element isolation described below.

Figure 9:
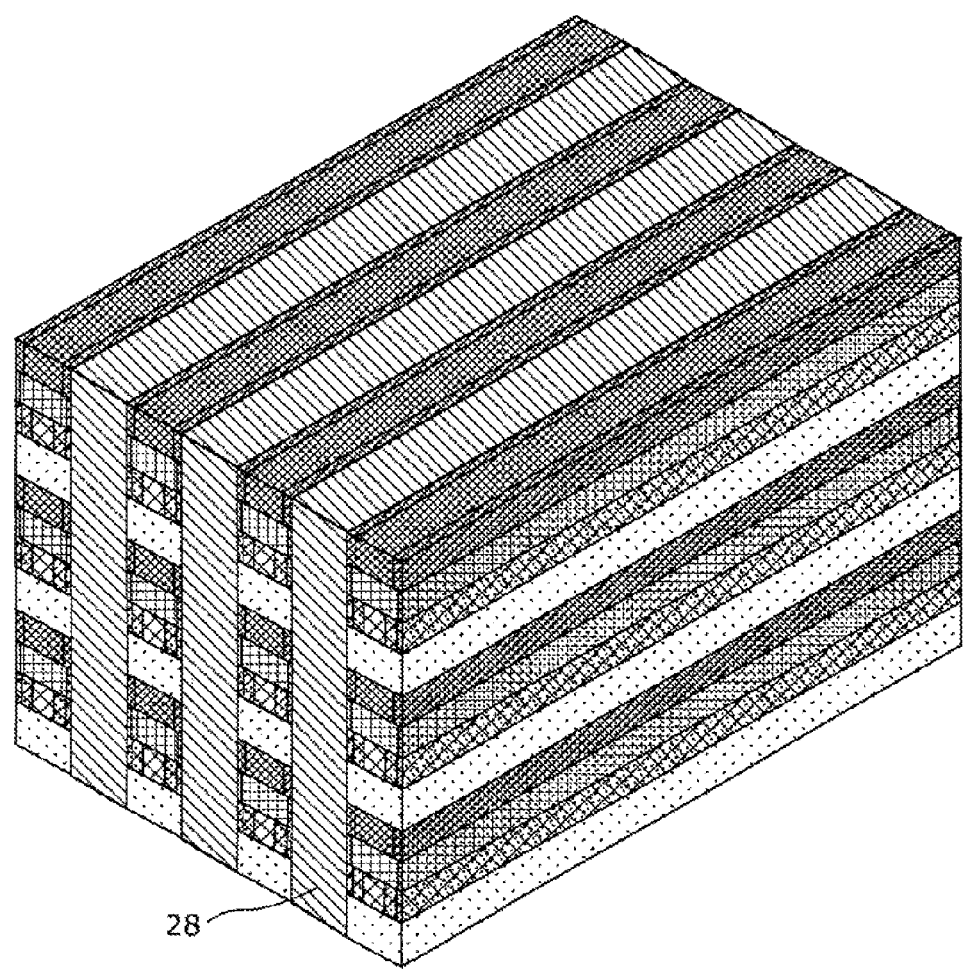
FIG. 9 is a perspective view of the non-volatile memory cell array in a manufacturing step according to Embodiment 2 of the as present invention.

Next, in the step shown in FIG. 9, a polysilicon 28 is deposited by CVD in the strip-shaped trench 27 previously formed. Then, through CMP process and other planarization processes, unnecessary polysilicons are polished and removed to leave the polysilicon 28 formed in the strip-shaped trench 27.

Figure 10:
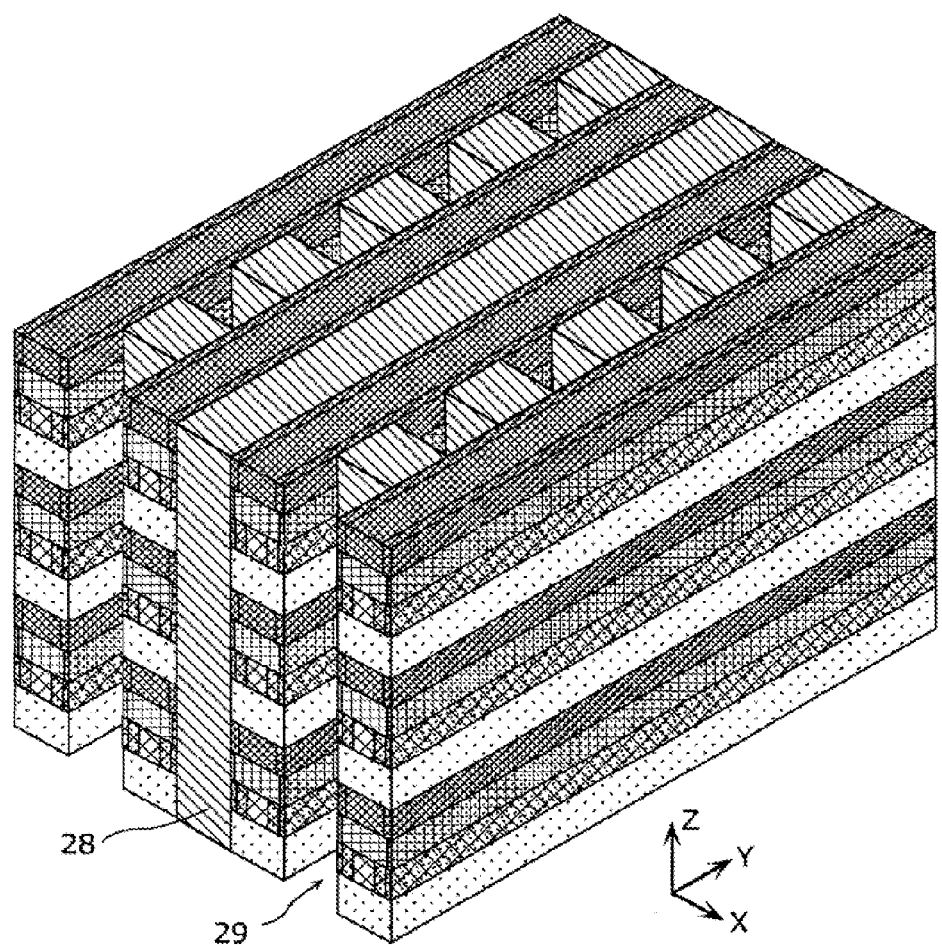
FIG. 10 is a perspective view of the non-volatile memory cell array in a manufacturing step according to Embodiment 2 of the present invention.

Next, in the step shown in FIG. 10, a contact hole 29 is formed by removing part of the polysilicon 28 on the main surface of the substrate in array in the direction perpendicular to the main surface of the substrate.

In the step shown in FIG. 10, first, a photoresist mask pattern having a predetermined pattern shape is formed through a general photolithography process. Next, the stacking structure is etched using the photoresist mask pattern to form the contact hole 29. Then, the mask pattern is removed. In addition, a hard mask may be used. Through the steps described above, the contact hole 29 is formed such that the interlayer insulating film 16, the first conductive layer 13, the semiconductor layer 17, and the second conductive layer 18 are exposed to an inner side face of the contact hole 29.

Figure 11:
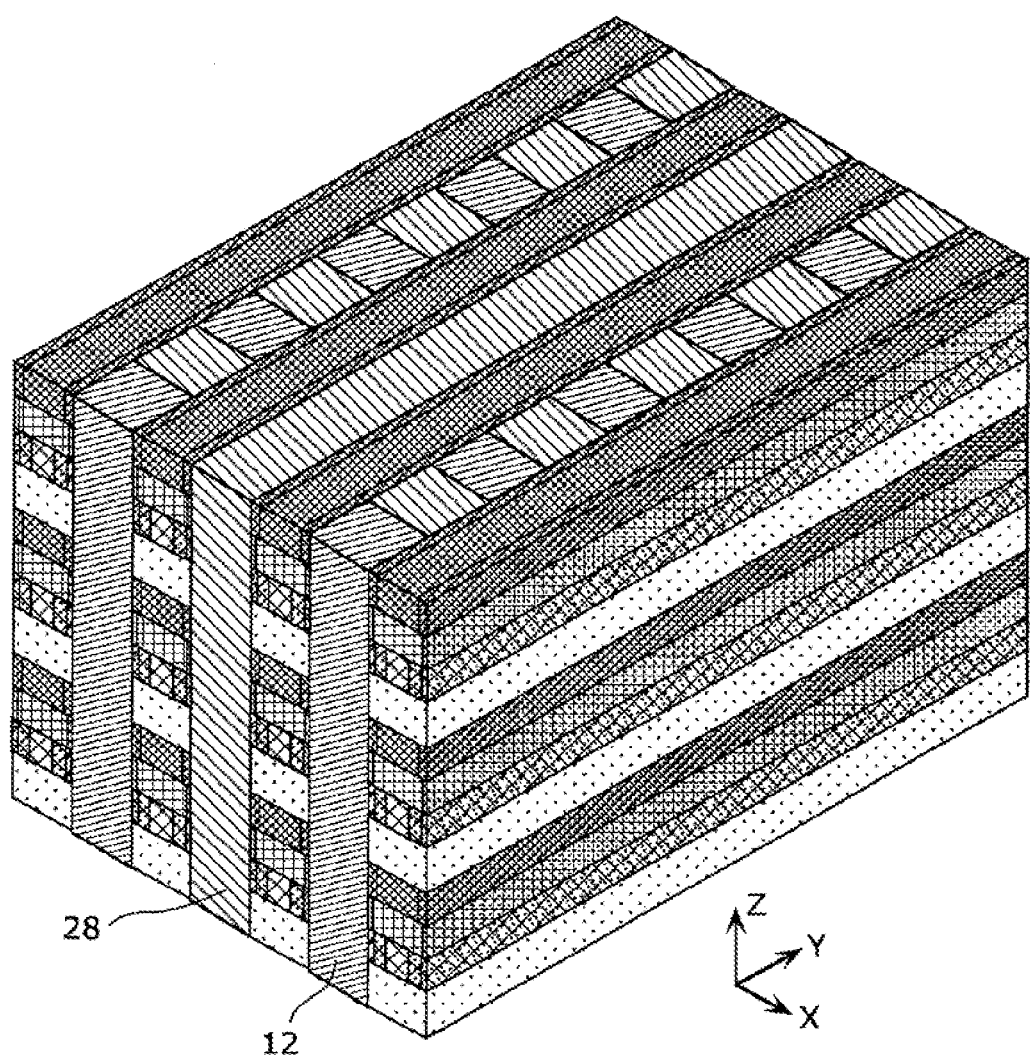
FIG. 11 is a perspective view of the non-volatile memory cell array in a manufacturing step according to Embodiment 2 of the present invention.

Next, in the step shown in FIG. 11, the columnar electrode 12 is deposited in the contact hole 29 by sputtering, CVD, plating, or the like. As a material of the columnar electrode 12, a conductive material such as platinum (Pt), iridium (Ir), palladium (Pd), copper (Cu), and tungsten (W), are used, for example. Then, through CMP (chemical mechanical polishing) process and other planarization processes, unnecessary electrode materials are polished and removed to leave the columnar electrode 12 formed inside the contact hole 29. It is to be noted that the columnar electrode 12 is directly in contact with the first variable resistance layer 13a, connected to the semiconductor layer 17 via the insulating layer 17, and connected to the second conductive layer 18 via the insulating layer 18a.

Figure 12:
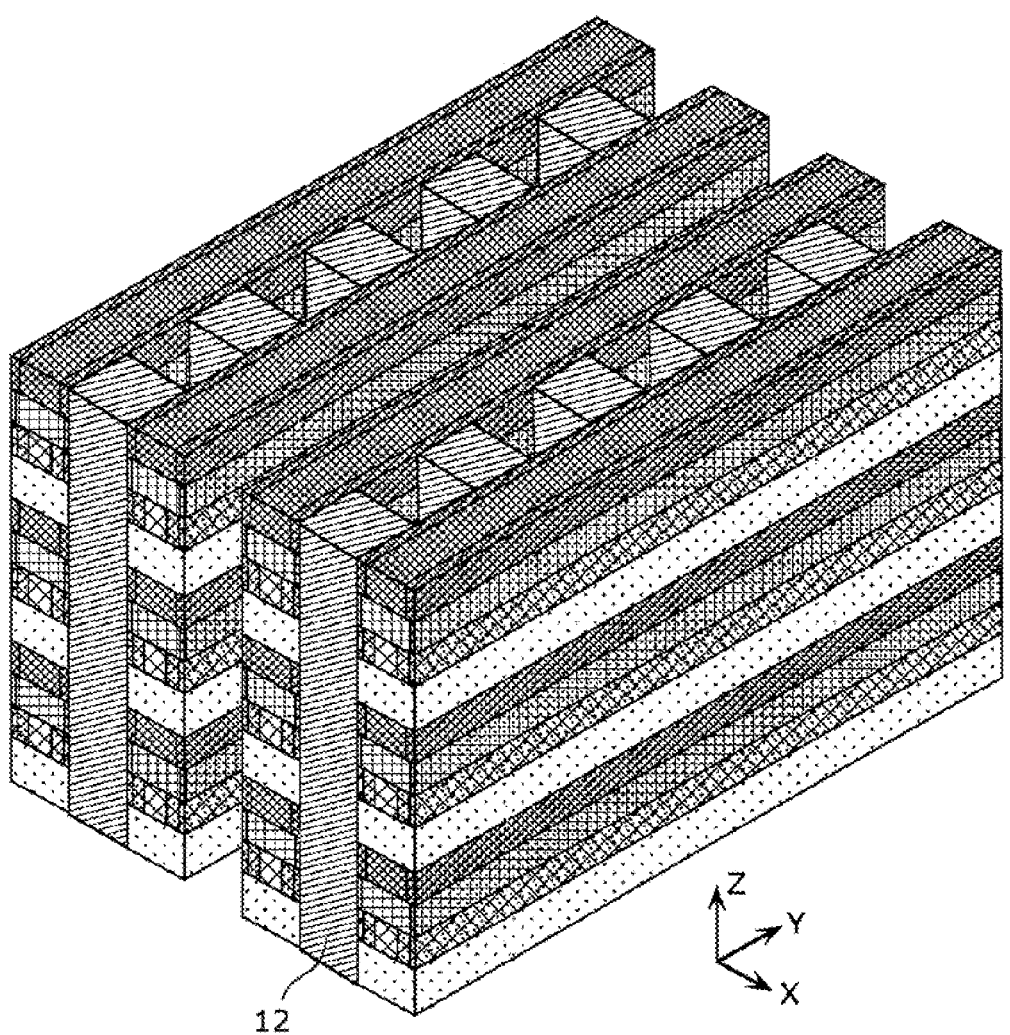
FIG. 12 is a perspective view of the non-volatile memory cell array in a manufacturing step according to Embodiment 2 of the present invention.

Next, in the step shown in FIG. 12, the polysilicon 28 disposed in a region other than the columnar electrode 12 in the strip-shaped trench 27 is removed by wet etching using $HF:HNO_3$ solution.

Figure 13:
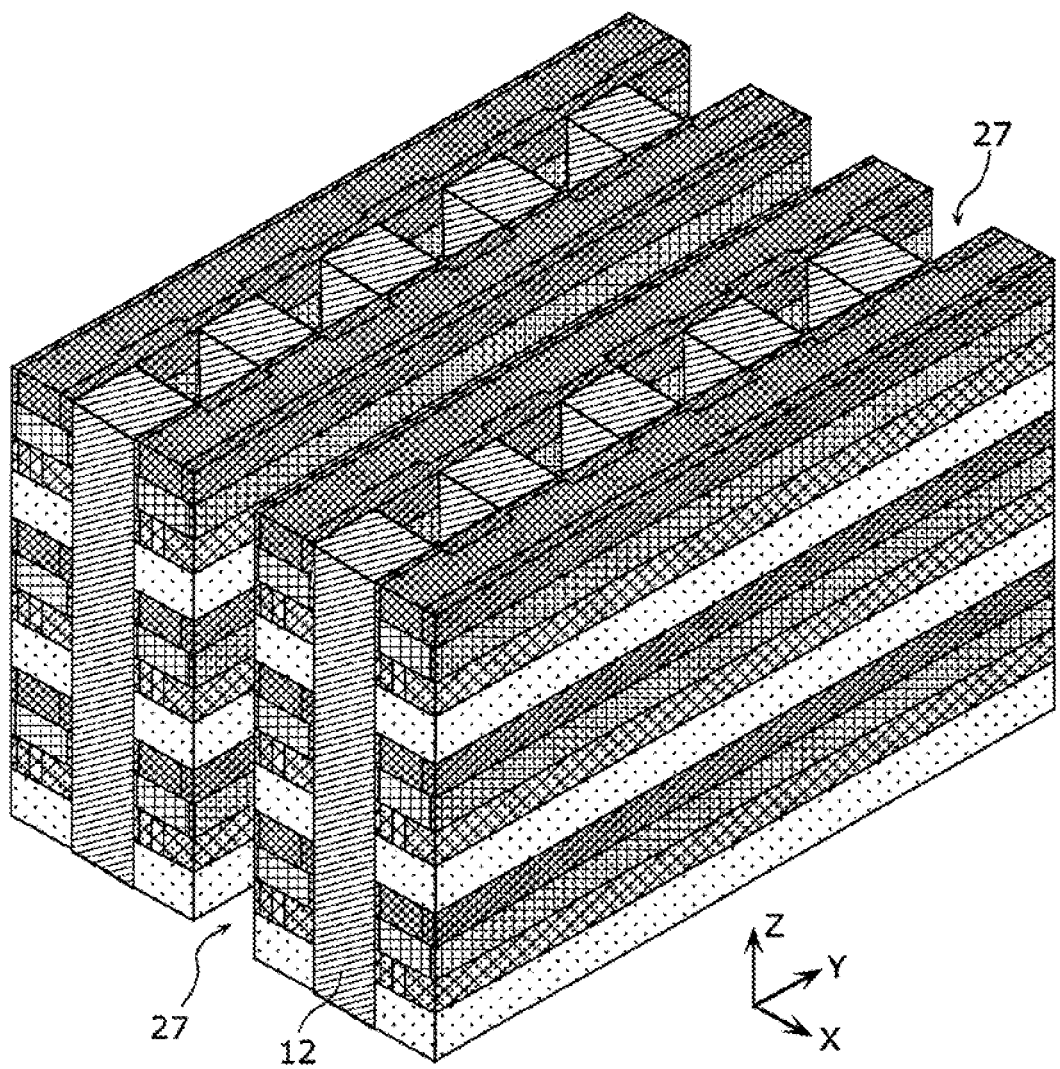
FIG. 13 is a perspective view of the non-volatile memory cell array in a manufacturing step according to Embodiment 2 of the present invention.

Next, in the step shown in FIG. 13, oxidation process is performed on the interlayer insulating film 16, the first conductive layer 13, the semiconductor layer 17, and the second conductive layer 18 which are exposed to a space (for simplification, this space is also called the strip-shaped trench 27), created by removing the polysilicon 28 in the strip-shaped trench 27.

Figure 14:
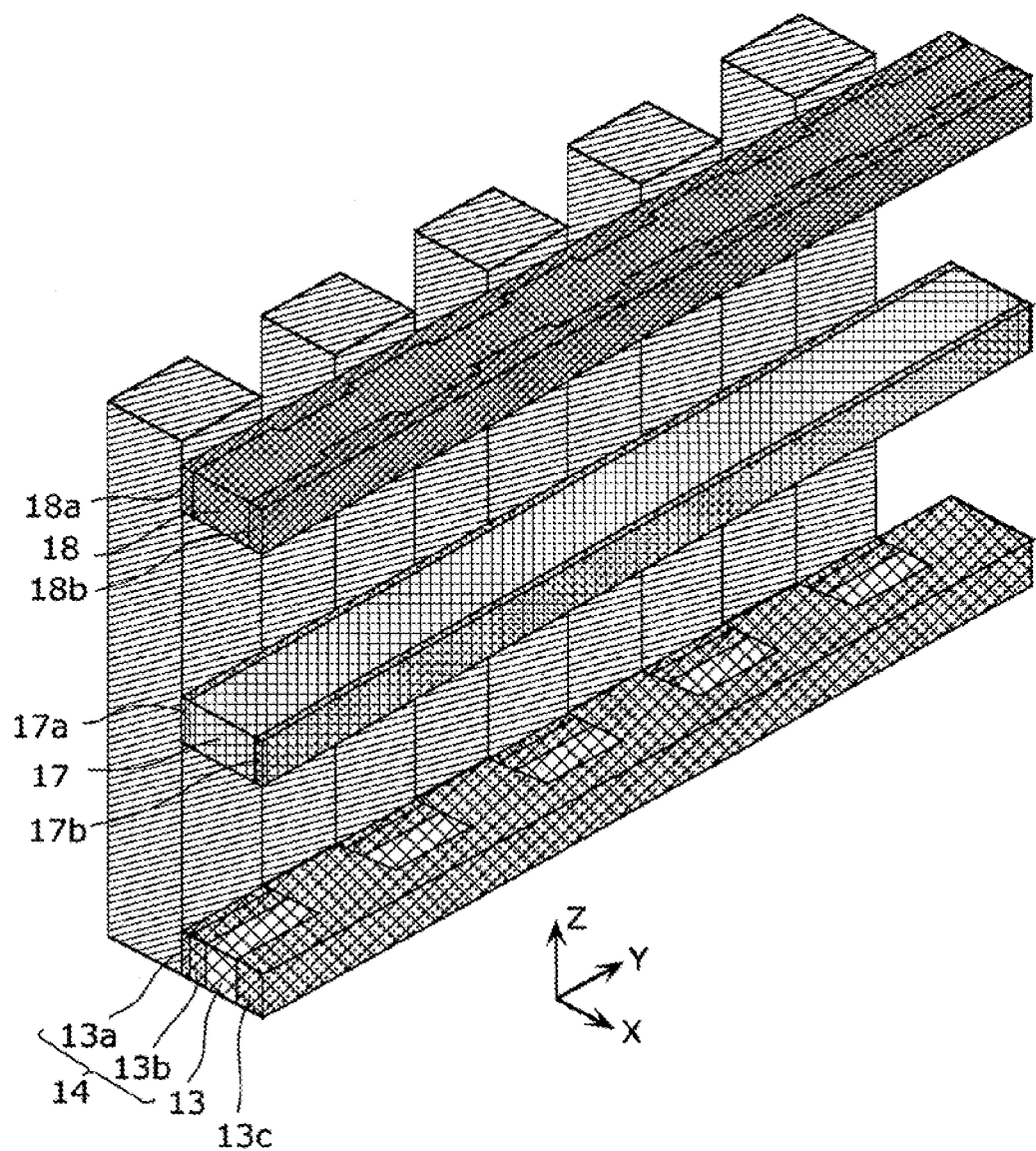
FIG. 14 is an exploded perspective view of a main section of the non-volatile memory cell array in a manufacturing step according to Embodiment 2 of the present invention.

FIG. 14 is an exploded perspective view of an example of shapes of the first conductive layer 13, the semiconductor layer 17, and the second conductive layer 18 after the oxidation process.

As shown in FIG. 14, in a region that is in contact with the columnar electrode 12 in each of the first conductive layer 13, the semiconductor layer 17, and the second conductive layer 18, oxidation does not progress because each of the regions is protected by the columnar electrode 12. Accordingly, the variable resistance layer 14, the insulating layers 17a and 18a are maintained as having the shapes shown in FIG. 7.

In the region of the first conductive layer 13 exposed to the strip-shaped trench 27, approximately half of the X direction width of the first conductive layer 13 is completely oxidized ($Ta_2O_5$) to serve as the insulating layer 13c. Particularly in a section where both ends of the width of the first conductive layer 13 are exposed to the strip-shaped trench 27, the entire section becomes the insulating layer 13c because oxidation progresses from both ends. This section serves as element isolation for isolating adjacent variable resistance layers 14.

At the same time, in the region of the semiconductor layer 17 exposed to the strip-shaped trench 27, oxidation does not progress to the inside because the insulating layers 17a and 17b which are $SiO_2$ protection films are provided on the surface. In addition, the thickness of TaON increases in the region of the second conductive layer 18 exposed to the strip-shaped trench 27, but a region of TaN that is the second conductive layer 18 remains inside because the oxidation rate of the TaON is lower than TaO that is the first conductive layer 13 as shown in the graph of FIG. 8, and thus the remaining region of TaN can serve as a word line.

After performing such oxidation processes, $SiO_2$ as the insulating layer 26 is embedded into the space created by removing the polysilicon 28 in the strip-shaped trench 27, thereby forming the non-volatile memory cell array 20 shown in FIG. 2A.

It is to be noted that, an example in which the polysilicon 28 is used as a filling material is presented in the above descriptions; however, other materials may be used. More specifically, it is sufficient that the filling material is a material that can be temporarily embedded in the strip-shaped trench and, in a subsequent step, selectively removed by wet etching or the like while leaving the interlayer insulating film 16 and the stacked bodies 21 including the first conductive layer 13, the semiconductor layer 17, and the second conductive layer 18.

Modification of Embodiment 2

The following describes a non-volatile memory cell array according to a modification of Embodiment 2 of the present invention.

Figure 15A:
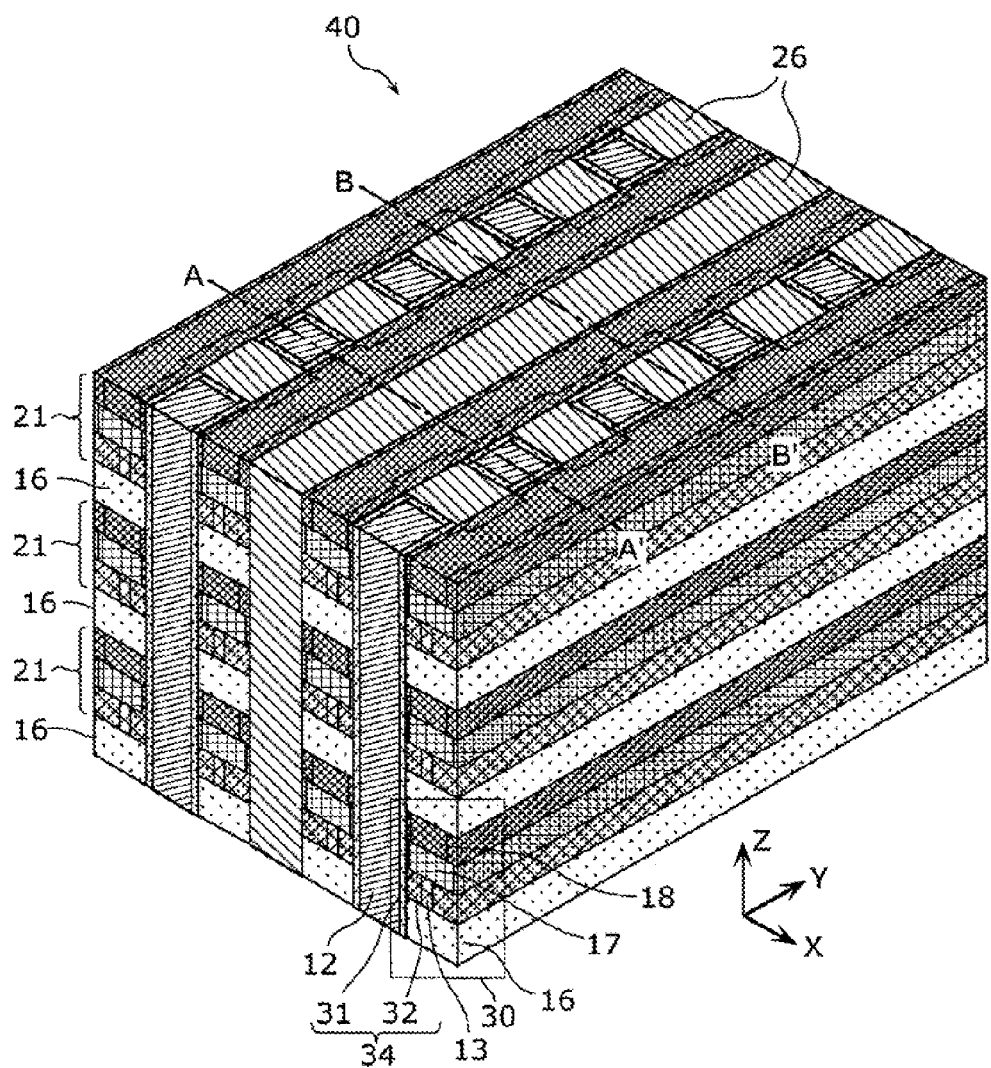
FIG. 15A is a perspective view of a non-volatile memory cell array according to a modification of Embodiment 2 of the present invention.
Figure 15B:
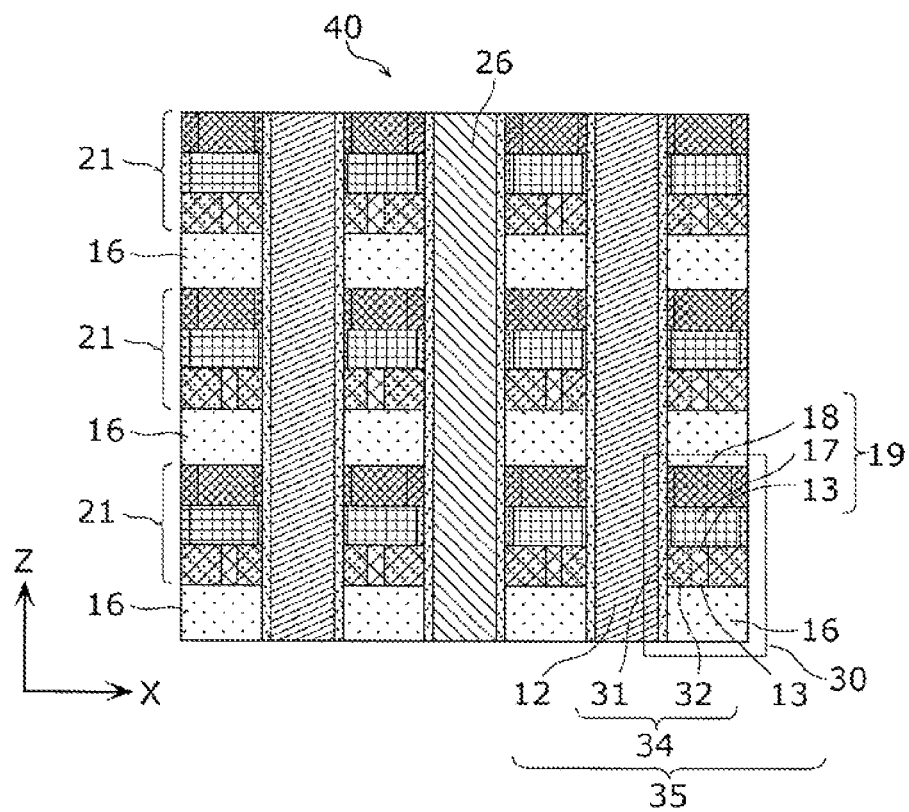
FIG. 15B is a cross-sectional diagram taken from the line A-A' of the non-volatile memory cell array according to the modification of Embodiment 2 of the present invention.
Figure 16:
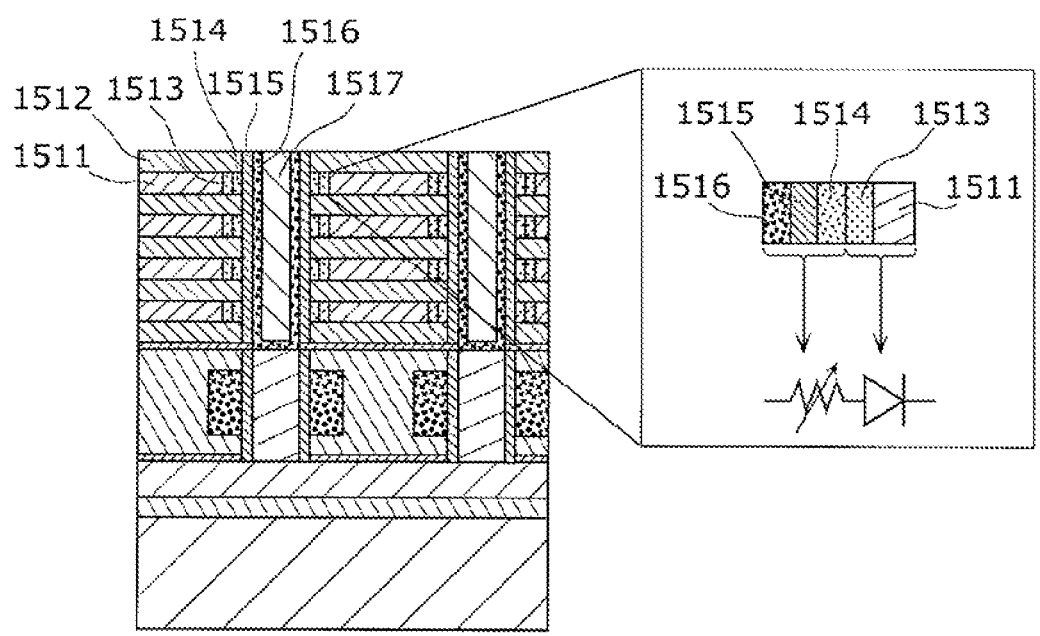
FIG. 16 is a cross-sectional diagram of a non-volatile memory cell array, and an enlarged view and an equivalent circuit diagram of a memory cell according to a conventional example.
Figure 17:
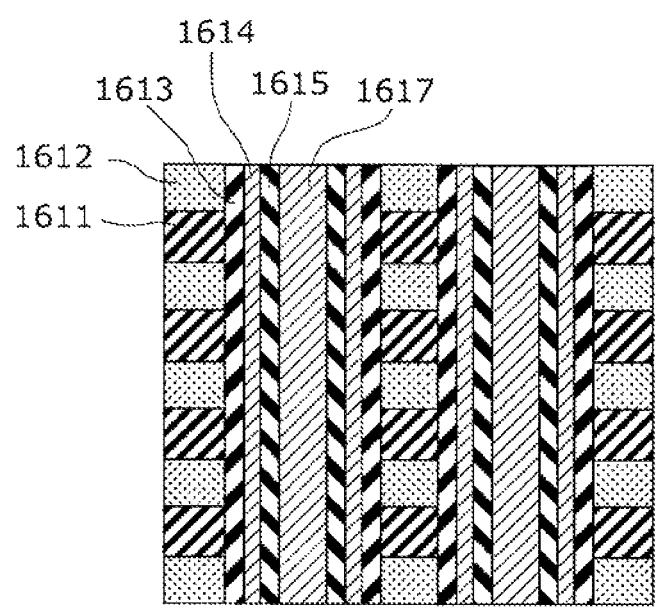
FIG. 17 is a cross-sectional diagram of the non-volatile memory cell according to the conventional example.

FIG. 15A is a perspective view of an example of a non-volatile memory cell array 40 according to a modification of Embodiment 2 of the present invention. FIG. 15B is a cross-sectional diagram taken from the line A-A' in the perspective view of the non-volatile memory cell array 40 shown in FIG. 15A. It is to be noted that the cross-sectional diagram taken from the line B-B' of the non-volatile memory cell array 40 is the same as the cross-sectional diagram taken from the line B-B' of the non-volatile memory cell array 20 shown in FIG. 2C, and thus the illustration is omitted.

As shown in FIG. 15A and FIG. 15B, in the non-volatile memory cell array 40, the non-volatile memory cell 10 included in the non-volatile memory cell array 20 shown in FIG. 2A and FIG. 2B is replaced with the non-volatile memory cell 30 according to the modification of Embodiment 1.

The non-volatile memory cell array 40 is different from the non-volatile memory cell array 20 in that the first variable resistance layer 31 is in contact with the side face of the columnar electrode 12 and formed to cover the side face. As shown in FIG. 15A and FIG. 15B, the non-volatile memory cell array 40 includes the first variable resistance layer 31 that is continuously provided not only at an intersection of the columnar electrode 12 and the second variable resistance layer 32 but also at an intersection of the columnar electrode 12 and the semiconductor layer 17, at an intersection of the columnar electrode 12 and the second conductive layer 18, and at an intersection of the columnar electrode 12 and the interlayer insulating film 16.

As described in the modification of Embodiment 1, such a shape is obtained by embedding the first variable resistance layer 31 and the columnar electrode 12 in this order in the contact hole.

More specifically, after forming the contact hole 29 through the step shown in FIG. 10, a material of the first variable resistance layer 31 is deposited on an inner wall of the contact hole 29 to be shaped into a thin film, by sputtering, CVD, plating, or the like, before forming the columnar electrode 12 in the step shown in FIG. 11. As a material of the first variable resistance layer 31, for example, a transition metal oxide of which a constituent metal is tantalum (Ta), hafnium (Hf), titanium (Ti), tungsten (W), nickel (Ni), iron (Fe), or the like can be used, and in particular, a transition metal oxide of which a constituent metal is different from a constituent metal of the second variable resistance layer 32 can be used.

In the manufacturing method of the non-volatile memory cell array 40, the step of embedding a material into a contact hole is composed of two steps; that is, embedding of the first variable resistance layer 31 and embedding of the columnar electrode 12, and thus it is possible to separate the step of forming the first variable resistance layer 31 from the step of forming the second variable resistance layer 32. As a result, with the non-volatile memory cell array 40, although there is a slight decrease in the simplification of the manufacturing procedures and the controllability of the thickness of the variable resistance layer 34 compared to the non-volatile memory cell array 20, it is possible to obtain an advantage that flexibility in selecting a material for the first variable resistance layer 31 increases.

It is to be noted that the manufacturing method according to the present invention is applicable, without being limited to the non-volatile memory cell array that is exemplified in the present embodiment 2. More specifically, it is possible to manufacture any electronic devices in which a variable resistance element is included, by applying the above-described manufacturing method or combining the above-described manufacturing method and a known method.

INDUSTRIAL APPLICABILITY

The non-volatile memory cell array according to the present invention is useful as a next-generation non-volatile memory and the like which is directed to lower power consumption, higher-speed writing, higher-speed deleting, and larger capacity.

REFERENCE SIGNS LIST 10, 30 non-volatile memory cell
12 columnar electrode
13 first conductive layer
13a, 31 first variable resistance layer
13b, 32 second variable resistance layer
13c insulating layer
14, 34 variable resistance layer
15, 35 variable resistance element
16 interlayer insulating film
17 semiconductor layer
17a, 17b insulating layer
18 second conductive layer
18a, 18b insulating layer
19 diode element
20, 40 non-volatile memory cell array
21 stacked body
26 insulating layer
27 strip-shaped trench
28 polysilicon
29 contact hole
1511 N-type polysilicon layer
1512 interlayer insulating film
1513 P-type polysilicon layer
1514 metal silicide layer
1515 variable resistance layer 1516 metal layer
1517 columnar electrode
1611 conductive layer
1612 interlayer insulating film
1613 variable resistance layer
1614 first semiconductor layer
1615 second semiconductor layer
1616 columnar electrode

The invention claimed is:

1. A non-volatile memory cell, comprising:
a columnar electrode disposed perpendicular to a main surface of a substrate;
a first conductive layer disposed parallel to the main surface of the substrate;
a semiconductor layer disposed in contact with said first conductive layer in a stacking direction;
a second conductive layer disposed in contact with said semiconductor layer in the stacking direction;
a variable resistance layer disposed between said columnar electrode and said first conductive layer, said variable resistance layer having a resistance value that reversibly changes according to an application of an electric signal;
an oxide insulating layer disposed between said columnar electrode and said semiconductor layer, said oxide insulating layer comprising a same constituent element as a constituent element of said semiconductor layer; and
an insulating layer disposed between said columnar electrode and said second conductive layer.

2. The non-volatile memory cell according to claim 1,
wherein said semiconductor layer is disposed on said first conductive layer,
said second conductive layer is disposed on said semiconductor layer, and
said variable resistance layer comprises a same constituent element as a constituent element of said first conductive layer.

3. The non-volatile memory cell according to claim 2,
wherein said variable resistance layer is formed exclusively at an intersection of said columnar electrode and said first conductive layer.

4. The non-volatile memory cell according to claim 2,
wherein said variable resistance layer has a degree of oxygen deficiency that increases from an interface between said variable resistance layer and said columnar electrode toward said first conductive layer.

5. The non-volatile memory cell according to claim 1,
wherein said second conductive layer comprises a same constituent metal as a constituent metal of said variable resistance layer.

6. The non-volatile memory cell according to claim 1,
wherein said variable resistance layer includes a first variable resistance layer and a second variable resistance layer which are stacked in a direction parallel to the main surface of the substrate, said first variable resistance layer having a first metal oxide, and said second variable resistance layer having a second metal oxide of which a degree of oxygen deficiency is larger than a degree of oxygen deficiency of said first metal oxide.

7. The non-volatile memory cell according to claim 6,
wherein said first variable resistance layer is formed in contact with a side face of said columnar electrode to cover the side face, and
said second variable resistance layer is formed exclusively at an intersection of said first variable resistance layer and said first conductive layer.

8. The non-volatile memory cell according to claim 1,
wherein said semiconductor layer is disposed between said first conductive layer and said second conductive layer in the stacking direction and in contact with both of said first conductive layer and said second conductive layer.

9. The non-volatile memory cell according to claim 1,
wherein said oxide insulating layer is disposed at a height same as a height of said semiconductor layer in the stacking direction, and
said insulating layer is disposed at a height same as a height of said second conductive layer in the stacking direction.

10. A non-volatile memory cell array, comprising:
a plurality of columnar electrodes disposed perpendicular to a main surface of a substrate;
a stacking structure in which a plurality of stacked bodies and a plurality of interlayer insulating films are alternately stacked, each of said stacked bodies including: a first conductive layer disposed parallel to the main surface of the substrate; a semiconductor layer disposed in contact with said first conductive layer in a stacking direction; and a second conductive layer disposed in contact with said semiconductor layer in the stacking direction;
a variable resistance layer disposed between said first conductive layer and a corresponding one of said columnar electrodes, said variable resistance layer having a resistance value that reversibly changes according to an application of an electric signal;
an oxide insulating layer disposed between said columnar electrode and said semiconductor layer, said oxide insulating layer comprising a same constituent element as a constituent element of said semiconductor layer; and
an insulating layer disposed between said columnar electrode and said second conductive layer.

11. The non-volatile memory cell array according to claim 10,
wherein said semiconductor layer is disposed on said first conductive layer,
said second conductive layer is disposed on said semiconductor layer, and
said variable resistance layer comprises a same constituent element as a constituent element of said first conductive layer.

12. The non-volatile memory cell array according to claim 11,
wherein said variable resistance layer is formed exclusively at an intersection of said columnar electrode and said first conductive layer.

13. The non-volatile memory cell array according to claim 11,
wherein said variable resistance layer has a degree of oxygen deficiency that increases from an interface between said variable resistance layer and said columnar electrode toward said first conductive layer.

14. The non-volatile memory cell array according to claim 10,
wherein said second conductive layer comprises a same constituent metal as a constituent metal of said variable resistance layer.

15. The non-volatile memory cell array according to claim 10,
wherein said variable resistance layer includes a first variable resistance layer and a second variable resistance layer which are stacked in a direction parallel to the main surface of the substrate, said first variable resistance layer having a first metal oxide, and said second variable resistance layer having a second metal oxide of which a degree of oxygen deficiency is larger than a degree of oxygen deficiency of said first metal oxide.

16. The non-volatile memory cell array according to claim 15,
wherein said first variable resistance layer is formed in contact with a side face of said columnar electrode to cover the side face, and
said second variable resistance layer is formed exclusively at an intersection of said first variable resistance layer and said first conductive layer.

17. The non-volatile memory cell array according to claim 10,
wherein said columnar electrodes are arranged at positions distributed in matrix on the main surface of the substrate.

18. The non-volatile memory cell array according to claim 10,
wherein said variable resistance layer comprises an oxygen-deficient metal oxide.

19. The non-volatile memory cell array according to claim 10,
wherein a constituent metal element of said first conductive layer and said variable resistance layer is tantalum.

20. The non-volatile memory cell array according to claim 10,
wherein said semiconductor layer is disposed between said first conductive layer and said second conductive layer in the stacking direction and in contact with both of said first conductive layer and said second conductive layer, in each of said stacked bodies.

21. The non-volatile memory cell array according to claim 10,
wherein in each of said stacked bodies,
said oxide insulating layer is disposed at a height same as a height of said semiconductor layer in the stacking direction, and
said insulating layer is disposed at a height same as a height of said second conductive layer in the stacking direction.

* * * * *